(12) United States Patent
Schipper

(10) Patent No.: US 10,571,807 B2
(45) Date of Patent: Feb. 25, 2020

(54) METHOD AND APPARATUS FOR ALIGNING SUBSTRATES ON A SUBSTRATE SUPPORT UNIT

(71) Applicant: ASML Netherlands B.V., Veldhoven (NL)

(72) Inventor: Bart Schipper, XK Delft (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/343,391

(22) PCT Filed: Sep. 28, 2017

(86) PCT No.: PCT/JP2017/036203
§ 371 (c)(1),
(2) Date: Apr. 18, 2019

(87) PCT Pub. No.: WO2018/074240
PCT Pub. Date: Apr. 26, 2018

(65) Prior Publication Data
US 2019/0258173 A1    Aug. 22, 2019

Related U.S. Application Data

(63) Continuation of application No. 15/299,285, filed on Oct. 20, 2016, now Pat. No. 10,133,186.

(51) Int. Cl.
*G03F 7/20* (2006.01)
*G03F 9/00* (2006.01)
*H01L 21/68* (2006.01)

(52) U.S. Cl.
CPC .......... *G03F 7/70141* (2013.01); *G03F 7/707* (2013.01); *G03F 9/7011* (2013.01); *H01L 21/68* (2013.01)

(58) Field of Classification Search
CPC .. G03F 7/707; G03F 7/70358; G03F 7/70816; G03F 7/70141
USPC ................................. 355/72–76; 310/10, 12
See application file for complete search history.

(56) References Cited

U.S. PATENT DOCUMENTS

| | | | |
|---|---|---|---|
| 6,172,738 B1 * | 1/2001 | Korenaga | G03F 7/70358 355/53 |
| 7,394,526 B2 * | 7/2008 | Shibazaki | G03F 7/707 355/72 |
| 8,885,149 B2 * | 11/2014 | Amin-Shahidi | G03F 7/70725 355/75 |

* cited by examiner

*Primary Examiner* — Hung Nguyen
(74) *Attorney, Agent, or Firm* — Finnegan, Henderson, Farabow, Garrett & Dunner, LLP

(57) ABSTRACT

The invention relates to an alignment apparatus for aligning a substrate, and a substrate processing system comprising such alignment apparatus. The alignment apparatus comprises an alignment base for supporting said substrate and/or a substrate support member, and a force generating device for applying a contact force on said substrate.
The force generating device comprises:
  an arm comprising a rigid proximal end a rigid distal end provided with a contact section for contacting an edge of said substrate, and an elastically deformable arm section extending between the rigid proximal and distal ends,
  a connection part connecting said rigid proximal end to said alignment base, said arm being movable with respect to said alignment base via said connection part, and
  an actuator for acting on and causing a displacement of said rigid proximal end,
whereby said contact force, defined by said elastically deformable arm section, is applied to said substrate by said contact section.

20 Claims, 11 Drawing Sheets

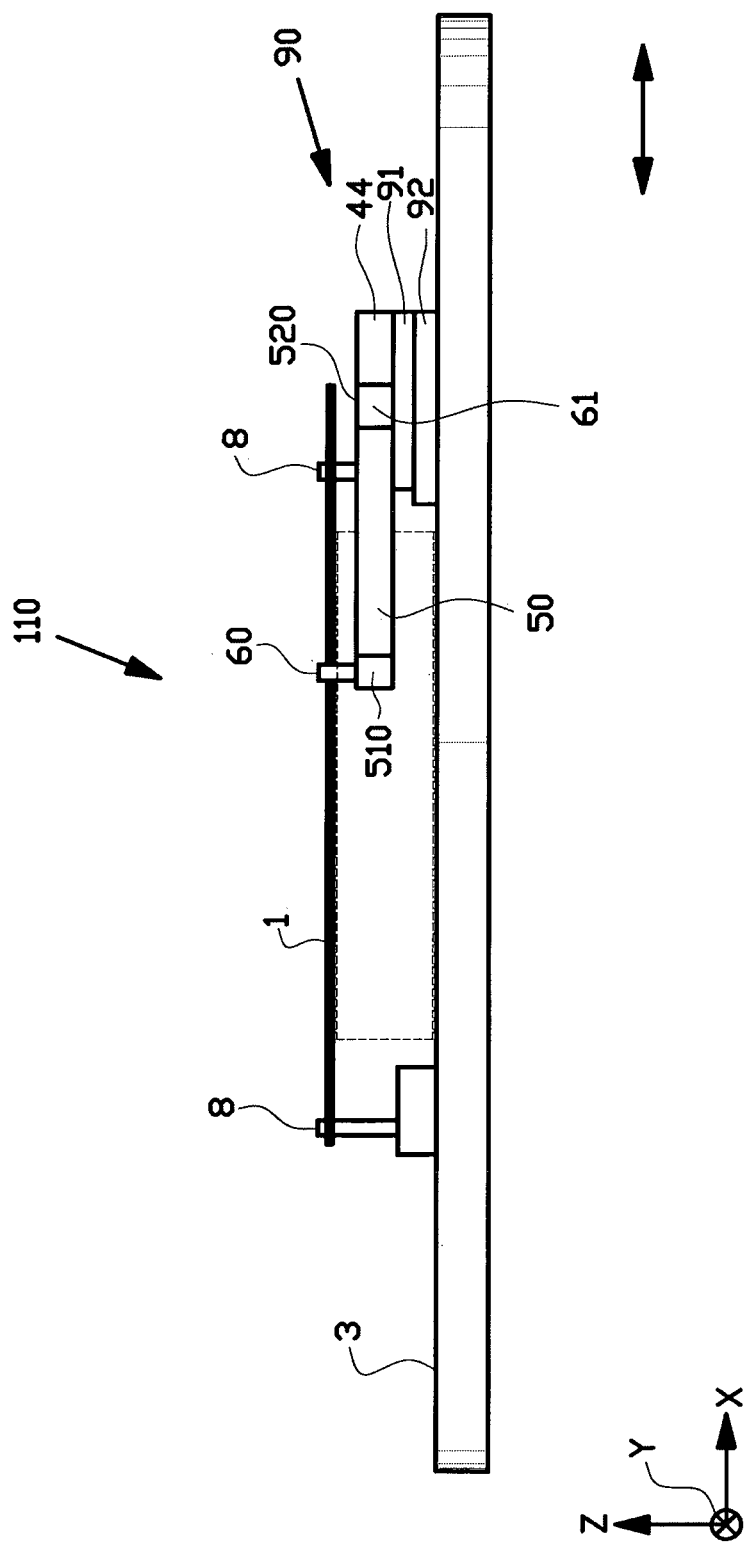

METHOD AND APPARATUS FOR ALIGNING SUBSTRATES ON A SUBSTRATE SUPPORT UNIT

CROSS-REFERENCE TO RELATED APPLICATIONS

This application is a U.S. national phase entry under 35 U.S.C. § 371 of PCT International Application No. PCT/JP2017/036203, filed Sep. 28, 2017, which is a continuation of U.S. Non-Provisional application Ser. No. 15/299,285, filed on Oct. 20, 2016, each of which is incorporated herein by reference in its entirety.

FIELD OF THE INVENTION

The invention relates to an alignment apparatus for aligning a substrate, comprising adjusting a substrate to a predetermined location on a substrate support member. The invention further relates to a lithography system in which such apparatus is applied. The invention also relates to a controlled force generating device configured to be applied in such alignment apparatus and/or lithography system. The invention further relates to a method for aligning a substrate.

DESCRIPTION OF RELATED ART

An alignment apparatus for a substrate is known from U.S. Pat. No. 5,700,297. In the known system a notched semiconductor wafer is laid flat on a plate. The notch of the notched semiconductor wafer is registered against a first roller that is fixedly mounted to the plate. A second roller, also fixedly mounted to the plate, registers a first point along the circumference of the wafer. A third roller is fixedly mounted to a bracket that is movable approximately along the radius of the wafer. The bracket is alternatively replaced by a pivot arm adapted to pivot about a pivot pin mounted to the plate. A force is applied to the bracket resulting in the third roller applying a force against the wafer. This resultant force, coupled with the rotating capability of the rollers allows the wafer to rotate into a proper registration position.

Another wafer positioning mechanism for positioning a notched wafer using a rollers is known from U.S. Pat. No. 5,028,200.

The applicant has found that during high-end lithography processing, in particular lithographic patterning, where the surface dimensions of the substrate need to be controlled to a very high degree of accuracy and reproducibility, the known alignment apparatus are not suitable. A typical semiconductor substrate is relatively thin compared to its diameter. This means that these semiconductor substrates are susceptible to distortion and shattering when they are aligned on a substrate support member.

Applicant has found that it is of high importance to provide an accurate and reproducible force to the wafer during alignment of the wafer in order to provide correct alignment, without distorting the wafer.

From the US patent publication 5102291, it is known to locate a wafer notch seeking pin on the distal end of a spring loaded arm. The US patent publication 4407627 describes an arrangement for orienting a wafer provided with an orientation cut. These known designs neither suit the contemporary standards of accuracy and reproduceability, nor solve the problems encountered with above cited U.S. Pat. Nos. 5,700,297 and 5,028,200.

A holder for holding a semiconductor substrate during deposition or removal of a layer on a surface of the substrate is known from WO99/18599. A cassette for maintaining wafers uniformly stressed during storage and transport thereof is known from CN2491943. These techniques do not provide sufficient accuracy for lithographic patterning.

It is an object of the present invention to ameliorate one or more of the above identified problems or to at least provide an alternative alignment apparatus for aligning a substrate, in particular a wafer, to be processed in a substrate processing system.

SUMMARY OF THE INVENTION

According to a first aspect the present invention provides a lithography system comprising a lithography apparatus and a substrate alignment station, said substrate alignment station comprising an alignment apparatus for aligning a substrate prior to introducing said substrate into the lithography apparatus, said alignment apparatus comprising:
  an alignment base for supporting said substrate and/or a substrate support member, and
  a force generating device arranged for applying a contact force on said substrate, said force generating device comprising:
    an arm comprising a rigid proximal end, a rigid distal end, and an elastically deformable arm section extending between said rigid proximal end and said rigid distal end,
    a connection part connecting said rigid proximal end to said alignment base, said arm being movable with respect to said alignment base via said connection part,
    an actuator arranged to act on said rigid proximal end to cause a displacement thereof,
  wherein said rigid distal end of said arm is provided with a contact section for contacting an edge of said substrate,
  whereby, upon said displacement of said rigid proximal end, said contact force is applied to said substrate by said contact section and is determined by said elastically deformable arm section and by said displacement of said rigid distal end.

The contact force, which is generally applied to a lateral edge of the substrate, will be determined by various properties of the arm and in particular by the elastically deformable arm section, such as the dimensions and the orientation of the arm, in particular its elastically deformable section, the amount of displacement of the proximal end of the arm and the resulting bending deflection of the elastically deformable arm section, and the spring characteristics of the elastically deformable arm section.

As described above, the arm does not have the same elastic and/or mechanical properties throughout its extension. The proximal and distal ends are rigid in comparison to the arm section extending therebetween. The proximal and distal ends generally have an extension along the length of the arm, forming sections of the arm, and can hence also be referred to as proximal and distal end sections, respectively. Preferably the end sections are not easily deformed, flexed or bent. The arm section extending between the rigid proximal end and the rigid distal end is elastically deformable. That is, the middle section of the arm has a higher degree of elasticity than the end sections. While the end sections preferably substantially do not deform during use of the force generating device, the elastically deformable arm section is configured to be bent, flexed or deformed as a result of the actuator causing a displacement of the rigid proximal end. As described above, the contact force is determined by the amount of displacement of the rigid proximal end and the properties of the elastically deformable arm section, such as its spring characteristics and the deformation resulting from the displacement of the rigid proximal end. As the actuating force is removed, the elastically deformable arm section regains its original shape.

Aligning the substrate comprises aligning the substrate with respect to a predefined coordinate system. The predefined coordinate system is typically a coordinate system applied within the lithography apparatus, e.g., within the exposure chamber. The coordinate system defines the position and/or orientation of various components arranged within the lithography apparatus. Alternatively, the predefined coordinate system has a specified relationship with the coordinate system of the lithography apparatus. The alignment apparatus enables aligning the substrate with high accuracy. The substrate can be aligned in one or more of the coordinates x, y, Rz. The coordinates x, y define a position within a plane, also referred to as alignment plane, in which the substrate is positioned. The alignment plane is generally substantially parallel to a surface of the alignment base receiving the substrate or a substrate support member, and parallel to the surface of a substrate support member receiving and supporting the substrate. The coordinate Rz defines a rotation with respect to a z-axis, the z-axis being oriented perpendicular to the alignment plane. The z-axis is generally substantially parallel to an optical axis of the lithography apparatus. The substrate can thereby be entered into the lithography apparatus in a known orientation with respect to one or more components therein, enabling exposure of the substrate surface with high accuracy.

The rigid proximal end of the arm is the part of the arm most proximal to the connection between the arm and the alignment base, and to the drivable element of the actuator. The rigid proximal end may also be referred to as first end or displacement end. The rigid distal end of the arm is distal from the connection to the base and from the actuator. The distal end may also be referred to as second end or substrate contacting end.

In many applications, the substrates to be aligned are wafers, e.g. silicon wafers. The amount of displacement of the rigid proximal end of the arm may vary between different wafers of a specific dimension, for example due to the dimensions of the wafer varying within tolerances. However, the inventors have observed that using the force generating device of the different aspects of the invention, the variation in contact force between different wafers is negligible.

Subsequent to the alignment of the substrate on a substrate support member, such as a wafer table or similar, the substrate can be clamped to the substrate support member. The substrate support member, with the substrate fixed thereon in an aligned manner, can subsequently be entered into the lithography apparatus for exposure, e.g. patterning, of the substrate.

The alignment apparatus described herein is especially suitable for charged particle beam lithography, in particular for use with an ion or electron beam lithography apparatus using a massive amount of parallel beams. However, it can equally well be used for other types of lithography systems, such as optical lithography, e.g., optical lithography using extreme ultraviolet light (EUV).

The effects and advantages described above with respect to the substrate alignment apparatus and/or the force generating device, in particular the arm thereof, apply analogously to the aspects described herein below.

According to a second aspect, the invention provides an alignment apparatus for aligning a substrate, said alignment apparatus comprising:

an alignment base for supporting said substrate and/or a substrate support member, and
a force generating device arranged for applying a contact force on said substrate,
said force generating device comprising:
an arm comprising a rigid proximal end and a rigid distal end, and an elastically deformable arm section extending between said rigid proximal end and said rigid distal end,
a connection part connecting said rigid proximal end to said alignment base, said arm being movable with respect to said alignment base via said connection part,
an actuator arranged to act on said rigid proximal end to cause a displacement thereof,
said rigid distal end of said arm being provided with a contact section for contacting an edge of said substrate,
whereby, by said displacement of said rigid proximal end, said contact force is applied to said substrate by said contact section and is defined by said elastically deformable arm section and by said displacement.

In embodiments, the alignment apparatus of the second aspect is used as the alignment apparatus of the lithography system according to the first aspect.

According to a third aspect, the invention provides a force generating device for applying a predefined contact force on an object, said force generating device comprising:
an arm comprising a rigid proximal end and a rigid distal end, and an elastically deformable arm section extending between said rigid proximal end and said rigid distal end,
a connection part connecting said rigid proximal end to a mounting part, such that said arm is movable with respect to said mounting part via said connection part,
an actuator arranged for acting on said rigid proximal end to cause a displacement thereof with respect to said mounting part;
said rigid distal end of said arm being provided with a contact section for contacting said object,
whereby, upon said displacement of said rigid proximal end, a contact force is applied to said object by said contact section, said force being defined by said elastically deformable arm section and by said displacement of said rigid proximal end.

In embodiments, the force generating device of the third aspect is used as the force generating device of the alignment apparatus of the second aspect, and/or as the force generating device of the lithography system of the first aspect.

The force generating device enables application of a predetermined force onto the object. The force generating device enables reproducibly exerting the predetermined force on the object. It is particularly configured for, in a reproducible manner, apply a relatively low force, e.g. a force of about 1N or less, onto the object. The force generating device is especially advantageous in applications where a substantially constant force has to be applied, especially in applications requiring a relatively low force.

The force generating device enables applying an accurate force to a substrate, such as a semiconductor wafer, during alignment thereof. The force applied to the substrate can be 1 N or less. Thereby an accurate alignment of the substrate can be provided, while avoiding, minimizing or at least reducing the risk of distorting or damaging the substrate.

According to a fourth aspect, the present invention provides a substrate processing system, such as a lithography system or an inspection system, comprising an alignment apparatus of the second aspect, a substrate processing apparatus for processing the aligned substrate, and a transfer system for transferring the aligned substrate from the alignment apparatus to the substrate processing apparatus.

The alignment apparatus provides a reliable way to align substrates for use in a lithography system or inspection system. The alignment apparatus is included in the lithography system or inspection system. Alternatively the alignment apparatus is separate from the system. In both cases, a transfer system is arranged to transfer an aligned substrate from the alignment apparatus to the substrate processing apparatus.

In the following, various embodiments are described of the lithography system according to the first aspect, the alignment apparatus according to the second aspect, the force generating device according to the third aspect, and the substrate processing system according to the fourth aspect.

In an embodiment, the actuator used for causing, inducing or bringing about the displacement is a pneumatic, electrical and/or hydraulic actuator, providing linear and/or rotational actuation. The actuator is arranged to exert or apply an actuating force and/or an actuating torque on the rigid proximal end of the arm. The actuator may be an actuator provided with a linearly moving drivable element arranged to provide an actuating force on the proximal end of the arm. Alternatively, the actuator may comprise an excentric wheel arranged to induce displacement of said rigid proximal end as the wheel is rotated with respect to a central axis thereof. Alternatively, the actuator may be realized by an arrangement comprising an electromagnet arranged to cause a displacement of the rigid proximal end of the arm upon activation and/or deactivation of the electromagnet. Further alternatively, the actuator may be arranged to provide an actuating torque on the rigid proximal end of the arm. Alternatively, actuation can be applied manually.

In an embodiment, the elastically deformable arm section is arranged to extend substantially perpendicular to a direction of said displacement of said rigid proximal end, the elastically deformable arm section being arranged to be oriented tangential to said edge of said substrate. Thereby, when applied to a substantially circular substrate such as a semiconductor wafer in an alignment apparatus, the contact force will be directed in a radial direction, towards a center of a substrate support area supporting the substrate. Thereby uncontrolled or unintended rotation of the substrate can be avoided. When the contact section is in contact with the edge of the substrate, also referred to as circumferential edge, the arm preferably extends in a direction substantially parallel to a tangent line of the edge of the substrate with respect to the point where the contact section contacts the substrate. Further displacement of the proximal end of the arm has the effect of slightly bending the elastically deformable arm section. This ensures a gradual build-up of the contact force applied by the contact section, and allows to accurately control the contact force that is applied to the substrate by the force generating device.

In an embodiment, the alignment apparatus comprises a support area on which, in use, a substrate or a substrate support member can be arranged. When a substrate is positioned on said support area or on the substrate support member located in the support area, upon alignment the edge of the substrate is arranged in mechanical contact with two contact members. The force generating device and the two contact members are arranged such that the substrate can be positioned in between them. The force generating device comprises a contact section, arranged for contacting the edge of the substrate. The contact section is arranged in the rigid distal end of the arm. The rigid proximal end of said arm is movably arranged with respect to the support area for providing a movement of the rigid distal end of the arm in a direction towards the edge of the substrate upon displacement of the rigid proximal end of the arm. When the contact section on the rigid distal end of the arm contacts the substrate, and the rigid proximal end is displaced further under the influence of the actuator, the elastically deformable arm section bends or flexes. Accordingly, the actuating force or torque which moves the rigid proximal end of the arm is not directly acting on the edge of the substrate. The amount of contact force exerted on the edge of the substrate is, inter alia, dependent on the elasticity of the elastically deformable arm section and on the amount of bending or flexure of the elastically deformable arm section. By controlling the displacement of the rigid proximal end of said arm, the amount of bending or flexure of the elastically deformable arm and thus the amount of force on the edge of the substrate can be accurately set.

Thus the alignment apparatus of the present invention allows applying an accurate and reproducible force to the substrate by controlling the displacement of the rigid proximal end of the arm in order to provide a bending or flexure of the elastically deformable arm section, which together with, e.g., the dimensions, orientation, and spring characteristics of the arm determines the contact force applied on the substrate. It is noted that the alignment apparatus of the invention allows to apply a very small force on the substrate, by applying an elastically deformable arm section with a high flexibility or low stiffness, and/or by controlling the displacement of the rigid proximal end of the arm to provide a small amount of bending or flexure of the elastically deformable arm when the contact section provided at the rigid distal end contacts the circumference of the substrate. This makes the alignment apparatus highly suitable for the alignment of a substrate, such as a wafer on a substrate support member, for example a wafer carrier or wafer table, in order to provide the correct alignment with a minimal or substantially no distortion of the wafer.

In an embodiment, said alignment apparatus comprises a displacement stop for limiting said displacement of said rigid proximal end. The displacement stop limits the amount of bending or flexure of the arm. The displacement stop thereby limits the contact force which can be applied to the substrate, and hence contributes to enabling the application of a predefined low force to the substrate. When the proximal end of the arm is in contact with the displacement stop, the force provided by the contact section and acting on the substrate is maximal. The displacement stop may be arranged on the opposite side of the arm compared to the actuator, confining the displacement the proximal end of the arm.

In an embodiment, a position of said displacement stop is adjustable. As the position of the displacement stop is adjustable, the amount of bending or flexure of the arm is adjustable. By adjusting the position of the displacement stop, the force that is applied to the edge of the substrate can be accurately adjusted to a desired value. In addition, the adjustable displacement stop allows to adapt the alignment apparatus to the diameter of the substrate.

It is noted that the contact force, in particular the magnitude of the contact force, applied on the substrate also depends on the stiffness of the arm, in particular the stiffness of the elastically deformable arm section.

In an embodiment, the alignment apparatus comprises two contact members connected to said alignment base and arranged for contacting said edge of said substrate. The two contact members are arranged spaced apart, arranged along a circumference of a support area arranged for supporting the substrate. The two contact members and the contact section of the distal end of the arm delimit a support area for the substrate, and confine a movement of the substrate. The substrate can thereby be aligned in a position defined by the two contact members and the contact section. The contact members define the x, y position of the substrate.

In an embodiment said contact members are movable towards and away from a center of an area defined by said contact members and said contact section. Thereby, the initial substrate support area delimited by the contact members and the contact portion prior to alignment can be enlarged, reducing the risk of the substrate landing on or otherwise contacting either one or both of the contact members as it is placed on the substrate support area. In some embodiments, the contact section and the contact members define a circle forming a circumference of the support area, the contact members being movable in a radial direction. Preferably, blocking members are provided for limiting a movement of said contact members towards said center. When the two contact members are arranged against the blocking members, the two contact members form fixed reference points for the alignment of the substrate.

In an embodiment said displacement of said proximal end is directed substantially perpendicular to an interconnecting line interconnecting said two contact members. The contact members are preferably arranged symmetrically with respect to the distal end of the arm. Thereby, forces exerted on the substrate by the two contact members will be symmetric.

In an embodiment said contact force is substantially perpendicular to an interconnecting line between said two contact members.

In an embodiment the arm is arranged to extend in a direction substantially parallel to an interconnecting line between said two contact members, in particular when the elastically deformable arm section is not bent or flexed.

In an embodiment said connection part comprises an elastically deformable connection section connected at a first end to said rigid proximal end and at a second end to a mounting part, said mounting part being connected to said alignment base. The elastically deformable connection section enables displacement, e.g. rotation and/or other movement, of the rigid proximal end of the arm, preferably within a plane parallel to the substrate plane. The mounting part is fixed with respect to the alignment base, at least in the direction of displacement of the rigid proximal end of the arm. Realizing a movement of the rigid proximal end with respect to the mounting part via an elastically deformable connection section avoids or at least minimizes friction between moving parts, hence minimizing the amount of particles released during displacement of the rigid proximal end of the arm. Thereby the risk of contamination of the substrate or the substrate support member, which in turn could decrease the quality of a subsequent clamping of the substrate to the substrate support member, is reduced. Furthermore, realising the relative displacement of the arm with respect to the alignment base by a connection part comprising an elastically deformable connection section can provide a controlled connection of the arm to the alignment base, the connection being substantially constant over time.

In an embodiment, the mounting part is arranged with its position being adjustable in one or more directions different from a direction of displacement of the proximal end.

In a further embodiment said elastically deformable connection section of the connection part comprises a portion of reduced cross section. Preferably, said elastically deformable connection section extends between a rigid section, connected to said rigid proximal end of the arm, and said mounting part. The reduced cross section, als referred to as neck or tapered section, has a smaller cross section than surrounding parts of the elastically deformable connection section. The reduced cross section provides a controlled and reproducible deformation of the connection part.

In an embodiment said connection part comprises a pivot arrangement, said pivot arrangement comprising a pivot axis, said rigid proximal end arranged to pivot around said pivot axis when said actuator causes said displacement of said rigid proximal end of said arm. The pivot axis is substantially perpendicular to the alignment base, and hence also to the surface of the substrate support member on which the substrate is positioned and/or to the upper surface of the substrate.

In an embodiment, the elastically deformable connection section of the connection part is realized by a leaf spring. The leaf spring is arranged for enabling rotation of the arm with respect to the mounting part, i.e., with respect to the alignment base. The leaf spring provides a reliable bending area of the elastically deformable connection section, which is elastically deformable in one direction to allow the arm, in particular the distal end of the arm, to rotate towards the edge of the substrate. Preferably, the elastically deformable connection section is arranged such that the movement and/or bending of the arm, in particular the movement of the rigid distal end provided with the contact section, is substantially in the same plane as the plane of the surface of the substrate support member and a substrate placed thereon. The leaf spring is stiff in all other directions ensuring that the movement and/or bending of the arm remains in the plane of the substrate support member.

In an embodiment the elastically deformable arm section comprises one or more leaf springs. The one or more leaf springs provide a suitable way to provide an elastically deformable arm section.

In a further embodiment, a surface of the one or more leaf springs comprised in the elastically deformable arm section is arranged in a direction substantially perpendicular to the surface of the alignment base. By arranging the surface of the leaf spring in a direction perpendicular to the surface of the substrate support member the leaf spring is able to provide bending of the arm such as to bend the distal end towards the substrate, whilst being substantially stiff in other directions.

In a further embodiment said elastically deformable arm section comprises a first leaf spring and a second leaf spring, wherein the second leaf spring is arranged substantially parallel to the first leaf spring and at a distance from the first leaf spring, in a direction substantially perpendicular to the surface of the first leaf spring. Accordingly, the first and second leaf springs are arranged parallel to each other in a longitudinal direction along the arm forming a parallel leaf-spring flexure. The first leaf spring and the second leaf spring thus form the opposite sides of a rectangular shape. This ensures that the leaf springs remain parallel to each other during bending, preventing rotation of the rigid distal end of the arm. A rotation of the distal end of the arm and the contact section provided thereon, in particular when the contact section is arranged to engage a notch provided in the edge of the substrate, adversely affects the alignment. By arranging the surfaces of the first and second leaf springs in a direction perpendicular to the surface of the substrate support member, the leaf springs enable bending of the rigid distal end of the arm towards the substrate, whilst being substantially stiff in other directions. The two parallel leaf springs provide an arrangement with high stiffness in all directions except the direction of displacement. This ensures that both the displacement of the rigid proximal end and the contact force that is applied to the substrate are accurate and reproducible.

The alignment apparatus comprises an actuator for driving the displacement of the rigid proximal end of the arm. An actuator provides a reliable way to control the displacement of the arm. When the actuator is switched on, the actuator will apply a force or torque onto the rigid proximal end of the arm, which will thereby be displaced. This displacement results in the rigid distal end of the arm moving towards the substrate. In an embodiment where the rigid proximal end of the arm is connected to the alignment base by means of a connection part comprising an elastically deformable connection section or a pivot arrangement, the actuator is arranged to apply a force onto the arm at a position in between the elastically deformable arm section and the connection part, i.e., within the rigid proximal end.

In an embodiment, the alignment apparatus comprises a bias arrangement arranged to apply a biasing force directed opposite to said displacement. This ensures that the rigid proximal end of the arm returns to its default position when the actuator is deactivated.

In an embodiment, the biasing element provides a force which is arranged to push the rigid proximal end of the arm towards the actuator, in order to substantially ensure that the arm stays in abutment with the actuator so that no displacement of the arm occurs when the actuator is not active. Displacement of the arm only occurs when the actuator is activated.

In an embodiment, said bias arrangement comprises a return spring. This enables using a pneumatic actuator also when operating the alignment apparatus in vacuum.

In an embodiment, said bias arrangement is realized by connecting said actuator to said arm. This means that the bias function is integrated in the actuator.

In an embodiment, the alignment apparatus is arranged for aligning a substrate provided with a notch in its edge, wherein the contact section is arranged to engage the notch. When the contact section engages the notch of the substrate, the contact section can provide a force to the substrate for driving a translation and/or rotation of the substrate, depending of the relative position of the contact section with respect to the notch and/or the shape of the notch, for moving the substrate into an aligned position. Alternatively, when the alignment apparatus comprises two contact members connected to said alignment base and arranged for contacting said edge of said substrate, either one of the contact members or the contact section can be used for engaging the notch. The $R_z$ alignment of the substrate will be determined by which of the contact section or the contact member engages the notch.

In an embodiment, the alignment apparatus is arranged for aligning a substrate provided with an orientation flat in its edge, said alignment apparatus comprising a third contact member, arranged to contact said orientation flat, and wherein the contact section is arranged to contact the orientation flat. The orientation flat is a flat portion provided in the circumference of the substrate. It forms an orientation mark alternative to the notch described above. Alternatively, the two contact members can be used to contact the flat portion. The $R_z$ alignment of the substrate will be determined by which of the contact section and the contact members contact the flat portion.

In an embodiment said contact section comprises a cylindrical element. This provides a defined contact area between the contact section and the substrate. It also provides a suitable shape for engaging a notch in the circumference of a substrate. The longitudinal axis of the cylindrical element is preferably oriented substantially perpendicular to a substrate support area located on a substrate support unit or the alignment base.

In an embodiment said cylindrical element is rotatably connected to said distal end of said arm. In this embodiment, if the initial position of the cylindrical element in the notch deviates from a center line of said notch, the cylinder can roll along the edge of the substrate towards a center position in the notch in order to bring the substrate into the aligned position. In case the cylindrical element is freely rotatable around its center line, a friction between the cylindrical element and the edge of the substrate is reduced or even substantially eliminated. A cylindrically shaped contact section further allows the substrate to move vertically along the contact section.

In an embodiment said contact members have substantially cylindrical shape. The longitudinal axis of the contact elements is preferably oriented substantially perpendicular to a substrate support area located on a substrate support unit or on the alignment base. The height of the contact elements is such that they can contact the edge of the substrate both during alignment of the substrate and once the substrate has been clamped or otherwise fixed to the substrate support member. Thus, the substrate can move in a vertical direction, substantially without losing contact with the contact section and contact members, hence maintaining the aligned position. This can be particularly advantageous when clamping the aligned substrate to the substrate support unit via a clamping mechanism influencing the vertical distance between the substrate and the substrate support member, such as during clamping by means of capillary forces.

In an embodiment said contact section and said contact members have a surface comprising a low friction material, said low friction material having a coefficient of friction which is lower than the coefficient of friction of said substrate edge. A low friction material reduces friction between the contact members and/or the contact section and the substrate. This ensures that when the contact section engages the notch for moving the substrate into an aligned position, the movement of the substrate is substantially not hindered by friction between contact members/section and the substrate. In this way, it is ensured that the substrate can be accurately and reproducibly arranged in the aligned position.

In an embodiment the movement of the contact section is a substantially linear movement, at least when the rigid proximal end of the arm is near the displacement stop, wherein the movement preferably is in a plane parallel to a substrate support area of the substrate support member. The movement of the contact section along a substantially linear path reduces angular errors of the alignment of the substrate.

In an embodiment said connection part comprises a contact translation arrangement arranged to enable a translating movement of said proximal end, in particular in a direction substantially perpendicular to an extension of said arm. For example, the contact translation arrangement may comprise a linear guide. In an embodiment hereof, the proximal end of the arm is connected to the substrate support member by means of a contact translation arrangement which is arranged to translate the proximal end of the arm, thereby enabling displacement of the proximal end of the arm. In this manner, instead of bending via an elastically deformable connection section as described above, the arm moves along a substantially linear path. The movement of the contact section along a substantially linear path reduces angular errors of the alignment of the substrate.

In an embodiment the alignment apparatus comprises a mounting plate, said actuator and said connection part being connected to said mounting plate. By mounting the actuator, the connection part, and, if present, the displacement stop, on the mounting plate, these can be fixedly or movably connected to the alignment base.

In a further embodiment said mounting plate is connected to said alignment base by an alignment translation arrangement, said alignment translation arrangement being arranged to enable a translating movement of said arm in a direction substantially parallel to an extension of said arm. The alignment translation arrangement enables adjustment of a position of the force generating device with respect to the substrate.

In an embodiment, the system comprises a substrate support member for supporting said substrate, said system being configured for aligning said substrate on said substrate support member. The alignment apparatus is configured to align the substrate into a predetermined position and/or orientation on the substrate support unit. Such substrate support member, also referred to as wafer table, may be configured to be entered into the lithography apparatus with the substrate clamped thereon, for supporting the substrate during exposure and during transport between the alignment station and the lithography apparatus.

In a further embodiment said substrate support member is positioned on said alignment base via a kinematic mount. This ensures that the substrate support member is located in a predefined position in the alignment apparatus. An identical kinematic mount is preferably provided in the lithography apparatus. Thereby, when the substrate support unit is positioned within the lithography apparatus, the substrate, which has been aligned on the substrate support unit in the alignment apparatus, will be aligned in the same position also in the lithography apparatus.

In an embodiment, alignment marks are provided on the substrate support member, or on a further unit on which the substrate support member is placed in a specified position. Alternatively and/or additionally, the substrate can be provided with one or more alignment marks. By detecting and reading out the alignment marks the position and orientation of the substrate with respect to an optical axis of a radiation projection system can be determined. Alternatively and/or additionally, the accuracy of the alignment apparatus can be verified and/or adjusted based on the result of the detection of the alignment marks.

In an embodiment said force generating device is configured such that said contact force is substantially constant when said displacement of said proximal end with respect to said distal end is within a predetermined interval. As described above, the contact force will be determined by the characteristics of the elastically deformable arm section, in particular, on the amount of bending of the elastically deformable arm section and on the spring constant.

In a fifth aspect, the invention provides a method for aligning a substrate, the method comprising:
positioning the substrate on an alignment base or on a substrate support member positioned on an alignment base;
providing a force generating device for applying a contact force on an edge of said substrate, said force generating device comprising:
an arm comprising a rigid proximal end and a rigid distal end, and an elastically deformable arm section extending between said rigid proximal end and said rigid distal end, said rigid distal end of said arm being provided with a contact section for contacting said edge of said substrate,
a connection part connecting said rigid proximal end to said alignment base, said arm being movable with respect to said alignment base via said connection part,
an actuator arranged to act on and cause a displacement of said rigid proximal end, whereby, by said displacement said contact force is applied to said substrate by said contact section, said contact force being defined by said elastically deformable arm section and by said displacement,
activating said actuator acting on said rigid proximal end, thereby causing said displacement of the rigid proximal end of said arm, thereby applying said contact force to said edge and causing a rotation and/or translation of said substrate into an aligned position.

This method enables highly accurate alignment of the substrate. The risk of damaging the substrate is reduced by the construction of the force generating device, which enables reproducible application of a low, predetermined force.

The displacement of the rigid proximal end of the arm leads to a deformation, or bending, of the elastically deformable arm section, whereby the rigid distal end of the arm moves towards the substrate. The contact section is allowed to contact the edge of the substrate, thereby applying the contact force thereon. The contact force will induce a movement of the substrate into an aligned position. As described above, the contact force will be determined by the properties of the arm, in particular on the position and orientation of the arm, the displacement of the rigid proximal end, and the spring characteristics of the elastically deformable arm section. These parameters can all be set in advance. Thereby, a predefined, low contact force can be achieved, in a reproducible manner. This enables highly accurate alignment of the substrate, while reducing the risk of damaging or distorting the substrate.

In embodiments, the force generating device is the force generating device of the third aspect described above.

In embodiments, the method for aligning the substrate according to the fifth aspect is performed using the alignment apparatus of the second aspect described above.

The alignment apparatus and the force generating device used in the method have the same effects and advantages as the alignment apparatus and the force generating device described above. The method may be used in a lithography system according to the first aspect, and/or in a substrate processing system according to the fourth aspect.

In an embodiment, the rotation and/or translation of the substrate is limited or confined by the contact section and the two contact members, the substrate being positioned between the contact section and the two contact members. Preferably, the contact section and the two contact members are positioned along a circle corresponding to the circumference of the substrate. The contact members are located at equal distances from a central line defined by the position of the contact section and the center of the circle.

In an embodiment said displacement, said actuating force, said actuating torque, and/or said contact force are directed within or parallel to a plane defined by a surface of said substrate.

In an embodiment a displacement of the rigid proximal end of the arm is terminated when said edge of said substrate contacts the contact section and the two contact members, said contact section and said contact members confining movement of said substrate. At this position, the substrate is in its aligned position.

In an embodiment, the method is applied on a substrate provided with a notch in its edge, the method comprising the steps of:
  positioning the notch in close proximity of the contact section,
  engaging the notch with the contact section, thereby actuating a rotation and/or translation of the substrate when the proximal end of the arm is displaced.

Substrates such as semiconductor wafers are often provided with a notch indicating the crystal orientation of the substrate surface. By positioning the contact section in the notch, the substrate will be rotated into a defined rotational position, aligning the substrate in the $R_z$ direction. Thereby, the accuracy of the alignment can be improved. As described above, alignment in the x, y coordinates is determined by the positions within this plane of the two contact members. During the movement of the contact section into the notch, the contact section can also apply a force onto the edge of the substrate when the contact section is not in the center of the notch, which rotates the substrate to position the contact section in the center of the notch and to arrange the substrate in the desired alignment position.

In an embodiment, the method comprises the steps of:
positioning said contact members in a first position, said first position being remote from a second position,
positioning the substrate on said substrate support member,
moving said contact members to said second position, thereby moving the contact members in a direction towards said substrate,
causing a displacement of said rigid proximal end such that said contact section and said contact members contact said edge of said substrate.

By positioning the contact members in the first position the area on which the substrate is to be placed can be increased, thereby reducing the risk of the substrate inadvertently touching one or more of the contact section and the contact members during positioning on the substrate support unit or the alignment base.

In an embodiment, the method comprises adjusting a position of said force generating device with respect to said contact members, in particular prior to said displacement of said proximal end of said arm. Thereby, the position of the contact section can be adjusted prior to positioning the substrate on the substrate support member. Thereby, the free area of the substrate support member can be increased, reducing the risk of the substrate touching the contact section or the contact members while being positioned on the substrate support unit. Alternatively or additionally, the position of the contact section with respect to the contact members can be adjusted into a defined position, increasing the accuracy and/or efficiency of the substrate alignment.

In an embodiment, the substrate is positioned on the substrate support member such that an orientation mark provided in a circumferential edge of said substrate, as described above, is located at a predetermined position.

In an embodiment, the position of the force generating device is adjusted in a calibration step, comprising aligning the substrate, measuring the position and/or orientation of the substrate, and, depending on the measured position and/or orientation, adjusting the position of the force generating device, in particular the position of the contact section of the arm of the force generating device.

According to a sixth aspect, the present invention provides a method for aligning a substrate on a substrate support member, using an alignment apparatus as described above, the alignment apparatus comprising the contact section and the two contact members, the method comprising the steps of:
  arranging a substrate on the support member,
  displacing the rigid proximal end of the arm,
  terminating displacement of the rigid proximal end of the arm when the substrate contacts the two contact members and the contact section, and the desired amount of bending or flexure of the arm has been obtained.

The method provides a reliable way to align a substrate using an alignment apparatus according to the invention. By using the alignment apparatus of the invention, the substrate is fixed between the two contact members and the contact section using a small force. This makes the method highly suitable for aligning a wafer on a wafer carrier, in order to provide the correct alignment with a minimal or substantially no distortion of the wafer.

In embodiments, the method of the sixth aspect comprises one or more of the embodiments described above with respect to the method according to the fifth aspect.

BRIEF DESCRIPTION OF THE DRAWINGS

The invention will be elucidated on the basis of exemplary embodiments shown in the attached schematic drawings, in which FIG. 1A schematically shows an industry standard substrate provided with a notch;

FIG. 6A shows a schematic perspective side view of a substrate alignment apparatus according to an embodiment of the invention;

DETAILED DESCRIPTION OF THE INVENTION

The following is a description of various embodiments of the invention, given by way of example only and with reference to the figures. The figures are not drawn to scale and are merely intended for illustrative purposes.

Figure 1A:
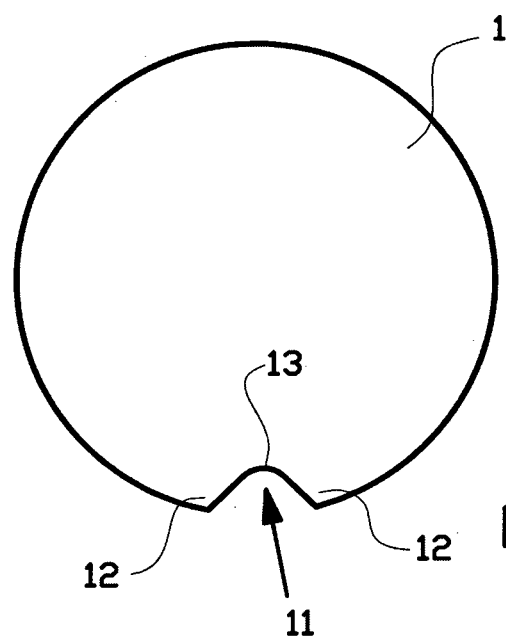
FIG. 1B schematically shows a detail of a typical notch of an industry standard substrate.
Figure 1B:
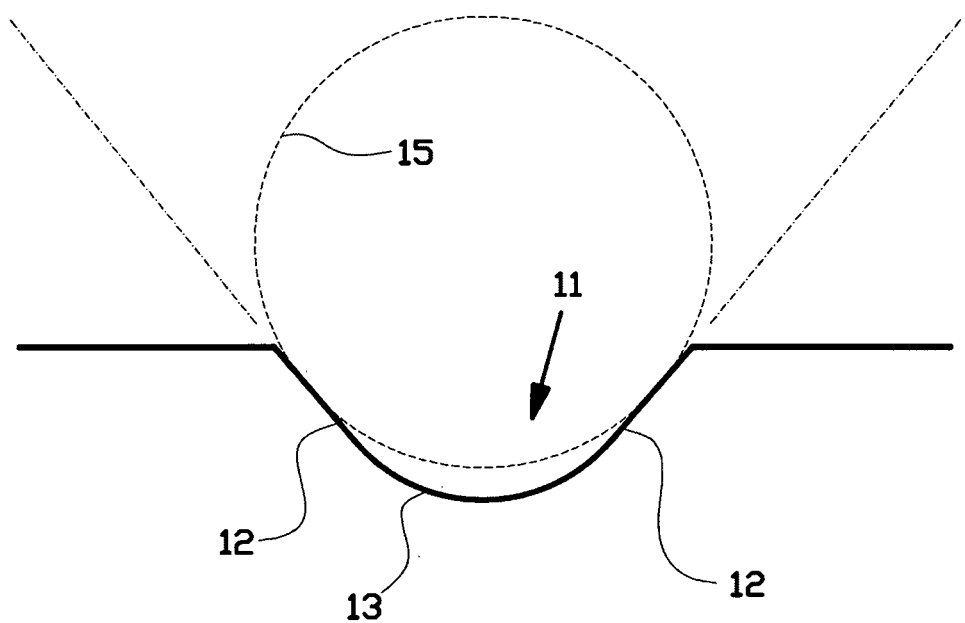

FIG. 1A schematically shows a standard substrate 1 provided with a notch 11 for use in a processing apparatus such as a lithography system. The notch 11 is used to align the substrate 1 on a substrate support member as will be discussed with reference to FIG. 2. FIG. 1B schematically shows a typical notch 11 used for standard substrates 1. Note that the size of the notch 11 has been exaggerated for clarity reasons. The notch 11 has a substantially triangular shape with straight edges 12 and a substantially circular central section 13. The notch 11 of FIG. 1B illustrates a notch of a present day standard substrate 1, alternatively known as a wafer, as defined by the Semiconductor Equipment and Materials International (SEMI). A typical standard substrate as defined by SEMI standards for use in a lithography system has a thickness of 0.775 mm for a 300 mm diameter substrate, and even less for smaller diameter substrates, making the substrates susceptible to bending and shattering during alignment on a substrate support member. FIG. 1B also shows the outline of a protrusion 15 that engages the notch 11. Although the invention will be discussed with reference to the predefined notch 11 compliant with present day SEMI requirements, embodiments of the invention can also be used for substrates 1 having a notch 11 with different dimensions or no notch at all, or to substrates having an orientation flat.

Figure 2:
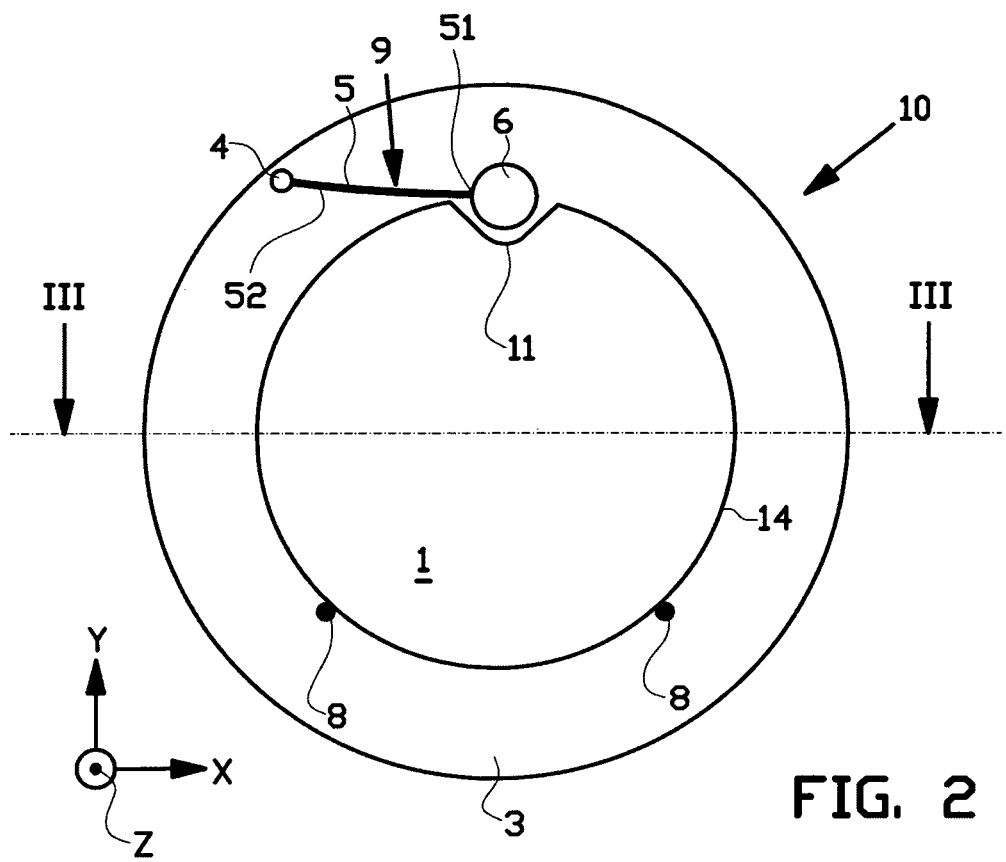
FIG. 2 schematically shows a top view of a substrate alignment apparatus according to an embodiment of the invention.

FIG. 2 schematically shows a top view of a substrate alignment apparatus 10 according to an embodiment of the invention.

The substrate alignment apparatus 10 comprises an alignment base 3. The alignment base 3 comprises a surface onto which a substrate support member 2 (see FIG. 3), configured for receiving the substrate 1, can be placed. Alternatively, the substrate alignment apparatus can be configured for receiving the substrate 1 directly on the surface of the alignment base 3. In general, the alignment base 3 will be larger than both the substrate support member 2 and the substrate 1 placed thereon. The alignment base 3 shown in FIG. 2 has a circular shape, but other shapes can also be used.

Figure 3:
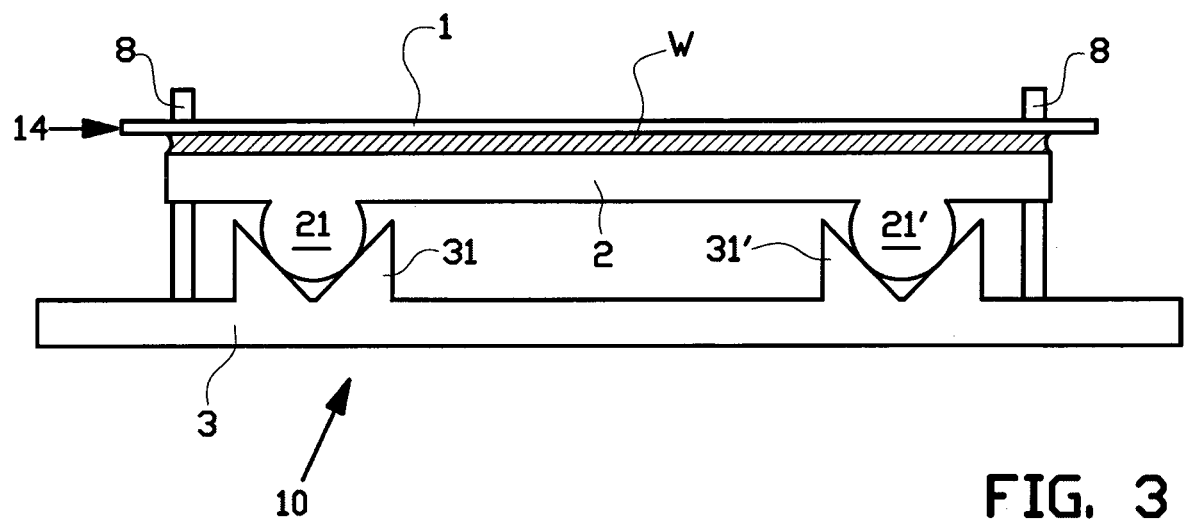
FIG. 3 shows a schematic cross section along the line III-III in FIG. 2.

As shown in FIG. 3, the substrate alignment apparatus 10 comprises mounting structure 31, 31' which are arranged for accurate and reproducible mounting of a substrate support member 2 within the support area of the alignment base 3. In the embodiment of FIG. 3, the substrate support member is provided with alignment members 21, 21' which are arranged to cooperate with the mounting structures 31, 31' of the alignment base 3. Typically, three mounting structures and three alignment members are provided, of which only two are shown. The alignment members 21, 21' and the mounting structures 31, 31' are for example arranged to provide a kinematic mount. The kinematic mount provides a specified relation between the substrate support member 2 and the alignment base 3. The mounting structures 31, 31' on the alignment base 3 are substantially identical to corresponding mounting structures provided within the substrate processing apparatus. Thereby, the substrate can be positioned in the processing apparatus in the aligned position.

The substrate support member 2 is arranged for supporting the substrate 1, and the substrate alignment apparatus 10 is arranged to align the substrate 1 with respect to the substrate support member 2 on the alignment base 3.

In the embodiment shown in FIGS. 2 and 3, the substrate alignment apparatus 10 further comprises two contact members 8 arranged on the alignment base 3. The contact members 8 are arranged spaced apart from each other and forms a blocking structure for the substrate 1. The contact members 8 are arranged for contacting an edge 14 of the substrate 1, blocking further movement of the substrate and establishing the aligned position of the substrate.

As shown in FIG. 2, the alignment apparatus further comprises a force generating device 9 arranged for applying a contact force FS on the substrate, in particular on its edge 14. The force generating device 9 comprises an arm 5 and a contact section 6 arranged at or near a distal end 51 of the arm 5, the distal end of the arm being the end of the arm most distant from the connection 4 or mounting of the arm to the alignment base 3. The contact section 6 is arranged for contacting the edge 14 of the substrate 1 facing away from the two contact members 8. When the contact section 6 contacts or abuts the edge 14 of the substrate 1, the position x,y of the substrate 1 within the plane of the substrate support member 2 and/or a receiving surface of the alignment base 3 is defined by the contact section 6 and the two contact members 8. In addition, when the substrate 1 is provided with a notch 11 and the contact section 6 is arranged in the notch 11, the contact section 6 fixes the position of the notch 11, and thereby also establishes the rotational position $R_z$ of the substrate 1 with respect to an axis perpendicular to the plane of the substrate receiving area of the substrate support member.

The proximal end 52 of the arm 5 is movably connected to the alignment base 3, by means of a connection part 4. Due to the connection part 4, the proximal end 52 of the arm 5 can be displaced within the plane of the substrate. Thereby, if an actuating force FA, oriented within the alignment plane and having at least one component directed toward the substrate, and/or an actuating torque TA, is applied to the proximal end 52, the proximal end will be displaced in the direction of the force or torque. The part of the arm 5 between the substantially rigid proximal end 52 and rigid distal end 51 is a substantially elastically deformable arm section which allows the arm 5 to bend substantially within a plane parallel to the surface of the substrate 1. Accordingly, under the application of the actuating force FA or the actuating torque TA to the rigid proximal end 52, the rigid distal end 51 can be moved towards the substrate 1 such that the contact section 6 contacts the edge 14 of the substrate 1 with a contact force FS. The arm 5 can be seen to function as a lever, transforming an actuating force FA applied to the proximal end of the arm to the contact force FS applied to the substrate by the distal end of the arm. The contact force FS acting on the edge of the substrate 1 depends on the spring constant of the elastically deformable section and the amount of bending or flexure of the elastically deformable section of the arm 5. By using an elastically deformable section of the arm 5 with a low spring constant and/or by limiting the amount of bending or flexure of the elastic section of the arm 5, the force FS on the substrate can be arranged to be large enough to provide a suitable positioning and alignment of the substrate 1 between the contact section 6 and the two contact members 8, while being low enough to cause minimal or substantially no distortion of the substrate 1. The substrate support unit may be configured for clamping or otherwise fixating the substrate once the substrate 1 is in the correctly aligned position. The substrate support member 2 with the correctly aligned substrate 1 is ready for removal from the alignment apparatus 10. Subsequently the substrate support member 2 with the correctly aligned substrate 1 can be placed in an inspection apparatus, such as an electron microscope, or in a processing apparatus, such as a lithography apparatus. Preferably the inspection apparatus or the processing apparatus comprises a substrate support member holding device provided with mounting structures for the substrate support member 2 substantially similar to the mounting structures 31, 31' of the alignment base 3. This enables maintaining the alignment of the substrate when positioning the substrate within the processing or inspection apparatus.

It is noted that although the contact section 6 and the contact members 8 are represented by round cylinders in FIGS. 2 and 3, different shapes and sizes are possible. Further, the contact section 6 and the contact members 8 or at least a portion thereof which in use abuts the substrate 1 during alignment, comprise a surface material and/or surface texture with predictable friction properties. Preferably said surface material comprises a low friction material, that is, a material having a friction coefficient lower than the friction coefficient of the substrate edge.

In FIG. 2, the contact section 6 is represented as a cylinder. Alternatively, one of the two contact members 8 is arranged to engage the notch 11 and the contact section 6 is arranged to contact the edge 14 of the substrate 1 to establish the correct alignment of the substrate 1. The $R_z$ alignment is determined by the one of the contact section 6 and the two contact members 8 engaging the notch.

It is further noted that the connection part 4 is arranged to enable rotation of the arm 5, and hence a movement of the contact section 6, within a plane parallel to the surface of the substrate 1. This movement results in rotation of the arm 5 and the contact section 6 connected thereto such as to approach the contact section 6 to the substrate 1.

Furthermore, in an embodiment, the force generating device 9 and/or the two contact members 8 are movably connected to the alignment base 3, in order to provide greater clearance when placing the substrate 1 or substrate support member 2 on the alignment base 3. In FIG. 2, the contact members 8 and/or the force generating device 9 are arranged in alignment positions, establishing the aligned position of the substrate 1. Before the substrate support member 2 and the substrate 1 are placed onto or removed from the alignment base 3, the two contact members 8 and/or the force generating device 9 can be moved away from the support area into a retracted position. This allows a substrate 1 or substrate support member 2 to be placed on the alignment base 3 without contacting the contact members 8 and/or the force generating device 9. After the substrate 1 and/or the substrate support member 2 are placed on the alignment base 3, the two contact members 8 and/or the force generating device 9 are moved towards the alignment position for aligning the substrate 1, as shown in FIG. 2.

Figure 4A:
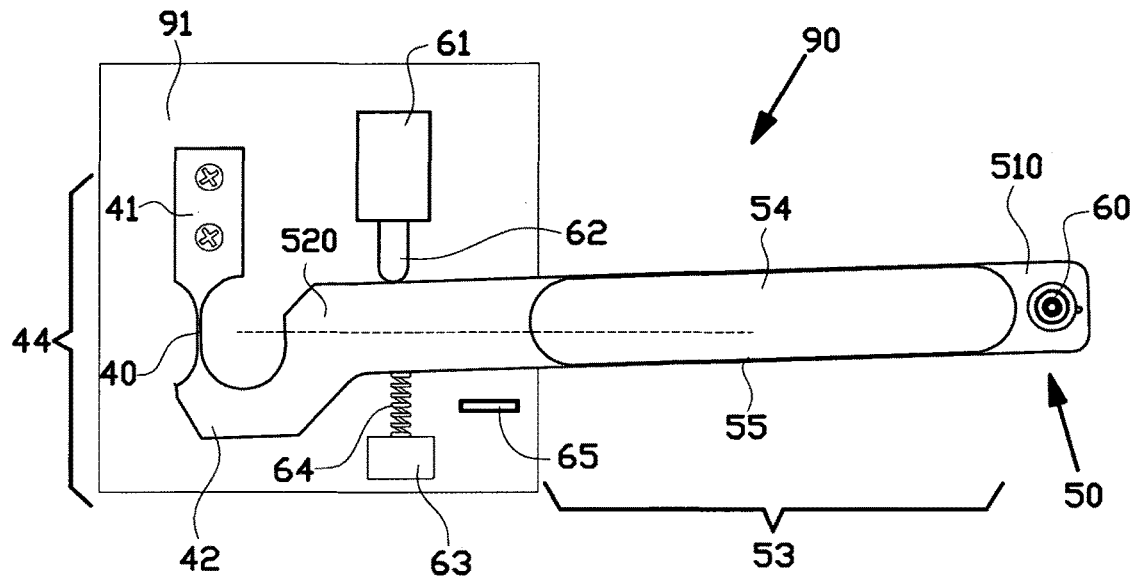
FIGS. 4A and 4B schematically show a top view of a force generating device according to an embodiment of the invention.
Figure 4B:
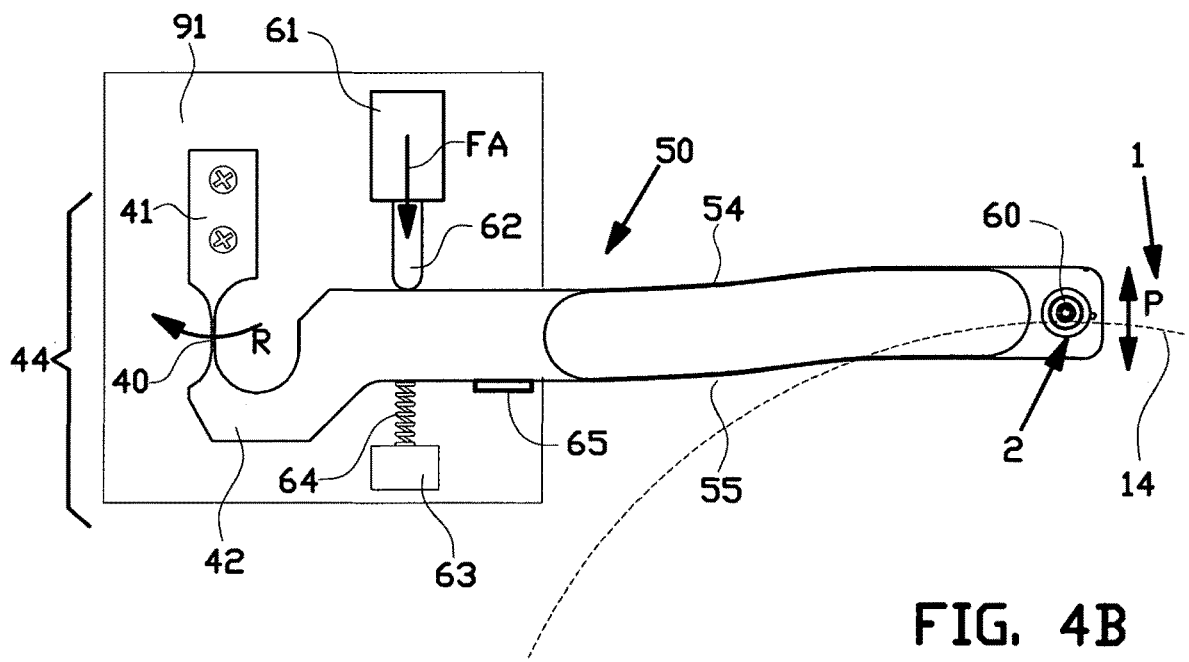

FIGS. 4A and 4B schematically show a top view of an embodiment of a force generating device 90. According to the invention, the force generating device 90 can substitute the force generating device 9 in the substrate alignment apparatus 10 illustrated in FIG. 2. The force generating device 90 of FIGS. 4A and 4B is also advantageously used in the alignment apparatus shown in FIG. 6A and 6B. The force generating device 90 illustrated in FIGS. 4A and 4B and described herein below can also be used in a variety of other applications for applying a substantially constant force to an object, especially in applications requiring a relatively low constant force. For example, such low force is of the order of magnitude of 1N.

The force generating device 90 comprises an arm 50 having a rigid proximal end 520 and a rigid distal end 510, and an elastically deformable arm section 53 extending between the proximal end and the distal end. The properties of these different sections of the arm, and the effects and advantages associated thereby, are as described above. As can be seen in FIG. 4A and 4B, the rigid proximal end 520 and the rigid distal end 510 both have an extension along the length of the arm 90. The arm 90 hence comprises three sections: the rigid proximal end section 520, the rigid distal end section 510, and the elastically deformable arm section 530 extending between the end sections. The elastically deformable arm section 53 is arranged to be elastically deformable in the direction of movement towards the object, in particular in a direction substantially parallel to the plane of the drawing of FIGS. 4A and 4B, and to be substantially rigid in all other directions.

FIG. 4A shows the force generating device when the actuator is not active, no actuating force or torque is applied to the rigid proximal end 520 of the arm, and the rigid distal end 510 is not in contact with the object. The arm 50 is at a distance to the displacement stop 65.

FIG. 4B shows the force generating device when the actuator is active, causing a displacement of the rigid proximal end 520 by applying an actuating force FA thereto. The displacement of the rigid proximal end 520 causes the rigid distal end 510 to contact an object, such as a substrate 1, exerting a contact force FS on its edge 14. The displacement of the rigid proximal end 520 leads to bending of the elastically deformable connection section 40, indicated by the arrow R. The rigid proximal end 520 of the arm is in contact with a displacement stop 65, blocking further displacement of the proximal end.

The rigid proximal end 520 is connected to a mounting part 41 via a connection part 44, enabling the arm 50 to move with respect to the mounting part 41. The mounting part 41 can be connected to a base, such as the alignment base 3 of the alignment apparatus 10, 110, either directly or via a mounting plate 91 arranged for mounting the various components of the force generating device 90 thereon. The mounting plate 91 allows mounting the force generating device 90 as one unit.

In the embodiment illustrated in FIG. 4A and B, the connection part 44 comprises an elastically deformable connection section 40. The elastically deformable connection section 40 is connected at one end to the rigid proximal end 520 via a rigid section 42, and at the other end to the mounting part 41. In the illustrated embodiment the elastically deformable connection section 40 comprises a portion of a reduced cross section. Alternatively, the elastically deformable connection section 40 may comprise a leaf spring arrangement, comprising one or more leaf springs arranged between the mounting part 41 and the rigid section 42. The mounting part 41 is rigidly attached to the mounting plate 91, and the rigid section 42 is rigidly attached to the proximal end 520 of the arm 50. In the example shown in FIGS. 4A and 4B, the rigid section 42 and the proximal end 520 are formed as one unit.

In the illustrated embodiment, the elastically deformable arm section 53 comprises two parallel leaf springs 54, 55 forming a parallel leaf-spring flexure. The leaf springs 54, 55 are arranged in a longitudinal direction of the arm 50 to allow bending or flexure such that the rigid distal end 510 moves towards the object. This is achieved by arranging the leaf springs in a plane substantially perpendicular to the surface of the substrate and the surface of the alignment base 3. The leaf springs 54, 55 are longitudinally elastically deformable and laterally stiff. The leaf springs 54, 55 together with the rigid proximal end 520 and the rigid distal end 510 form a substantially rectangular shape, e.g. a parallel leaf-spring flexure. As illustrated in FIG. 4B, the leaf springs 54, 55 will remain substantially parallel to each other during bending, which substantially prevents rotation of the rigid distal end 510 with respect to the rigid proximal end 520 of the arm 50. This results in an arm 50 which is able to provide a small force to the object, determined by the amount of flexure of the arm 50.

The rigid distal end 510 of the arm 50 is provided with a contact section 60 for contacting the edge 14 of the object. The contact section 60 is, in particular, adapted for engaging the notch 11 of the substrate 1. In this example, the contact section 60 is provided as a cylindrical element rotatably connected to the distal end of the arm, for example via a bearing, which is arranged to provide a substantially freely rotatable circumferential surface of the contact section 60. Alternatively or additionally, the contact section 60 can be made from a low-friction material.

The substrate positioning device 90 further comprises an actuator 61 for providing an actuating force FA to the rigid proximal end 520 of the arm 50. Upon application of the actuating force FA, a contact force FS will be applied to the object by the contact section 60. As described above, the contact force is defined by the characteristics of the elastically deformable arm section.

In the illustrated embodiment, the actuator 61 comprises a drivable element 62. The drivable element 62 is arranged to provide the actuating force FA to the rigid proximal end 520 of the arm 50. In order to effect a displacement of the rigid proximal end 520, the actuator 61 is driven to provide a driving force FA which overcomes the spring force of the elastically deformable connection section 40. As illustrated in FIG. 4B, when the contact section 60 contacts the edge 14 of the substrate, the displacement of the rigid proximal end 520 causes a bending of the elastically deformable arm section 53. The amount of bending or flexing of the elastically deformable arm section, along with its spring constant and length, will determine the contact force FS applied to the substrate.

When the actuator 61 is powered off, the elastically deformable connection section 40 of the connection part 44 will return the arm 50 to the position where spring force of the elastically deformable connection section 40 is substantially zero. Alternatively or additionally, the force generating device 90 comprises a bias arrangement arranged to apply a biasing force FB directed opposite to the actuating force FA, providing an additional force urging the arm 50 to its default position. In the embodiments of FIG. 4A and 4B, the bias arrangement comprises a return spring 64. The return spring 64 is fixed at one end 63 to the mounting plate 91 or directly to a base, and is arranged to provide a biasing force pushing the rigid proximal end 520 of the arm 50 towards the actuator 61. Thereby the arm 50 stays in contact with the drivable element 62 of the actuator 61, and the rigid proximal end of the arm follows the movement of the drivable element 62 of the actuator 61. Alternatively, the bias arrangement can be provided by connecting the drivable element 62 to the rigid proximal end 520 of the arm 50.

In an alternative embodiment, the actuator 61, comprising the drivable element 62, and the return spring 63 can be replaced by an arrangement comprising one or more electromagnets arranged to attract or repulse the proximal end of the arm, as the electromagnets are switched on or off. In such embodiment, the proximal end of the arm comprises a magnetic section or portion.

It was found that a suitable contact force applied to the substrate in order to successfully engage the notch and align the substrate is less than 1 N. Applying a force of this magnitude ensures proper alignment without distorting or damaging the substrate.

In FIG. 4B, the actuator 61 is actuated and causes a displacement of the rigid proximal end of the arm, by applying an actuating force FA to the rigid proximal end 520 of the arm 50, the actuating force FA being larger than a spring force of the elastically deformable connection section 40 and the biasing force FB from the return spring 64. The resultant force has the effect of displacing the proximal end 520, causing bending or deformation of the elastically deformable arm section 53 as the contact section 60 contacts the substrate 1. Since the proximal end 520, and the distal end 510, are rigid, deformation of the arm will be limited to the elastically deformable arm section 53, providing a defined force to be applied by the contact section 60. In the illustrated example, the elastically deformable connection section 40 is bending as indicated by the arrow R, the rigid section 42 and the rigid proximal end 520 thereby being displaced with respect to the mounting part 41. When arranged in one of the alignment apparatuses of FIG. 2 or FIG. 6A, 6B, the contact section 60 will contact the edge 14 of the substrate 1 thereby pushing the substrate 1 into contact with two contact members 8. The displacement of the rigid proximal end 520, and hence the amount of bending of the elastically deformable arm section 53, is limited by the displacement stop 65. When the rigid proximal end 520 of the arm 50 is blocked by the displacement stop 65 as shown in FIG. 4B, the force provided by the contact section 60 onto the substrate 1 is maximal. Accordingly, the actuator 61 needs only to be turned on or off in order to operate the alignment apparatus to apply the specified contact force FS to the substrate. The control of the motion is thus simple and robust.

It is noted that in the position shown in FIG. 4B, the arm 50 extends substantially in a direction substantially parallel to a tangential line of the edge 14 of the substrate at the point where the contact section 60 contacts the substrate 1.

It is further noted that during the deformation of the elastically deformable arm section 53, the contact section 60 will move along a substantially linear path P, since the leaf springs 54, 55 remain parallel to each other, at least when the amount of flexing is small with respect to the length of the arm 50.

Figure 5A:
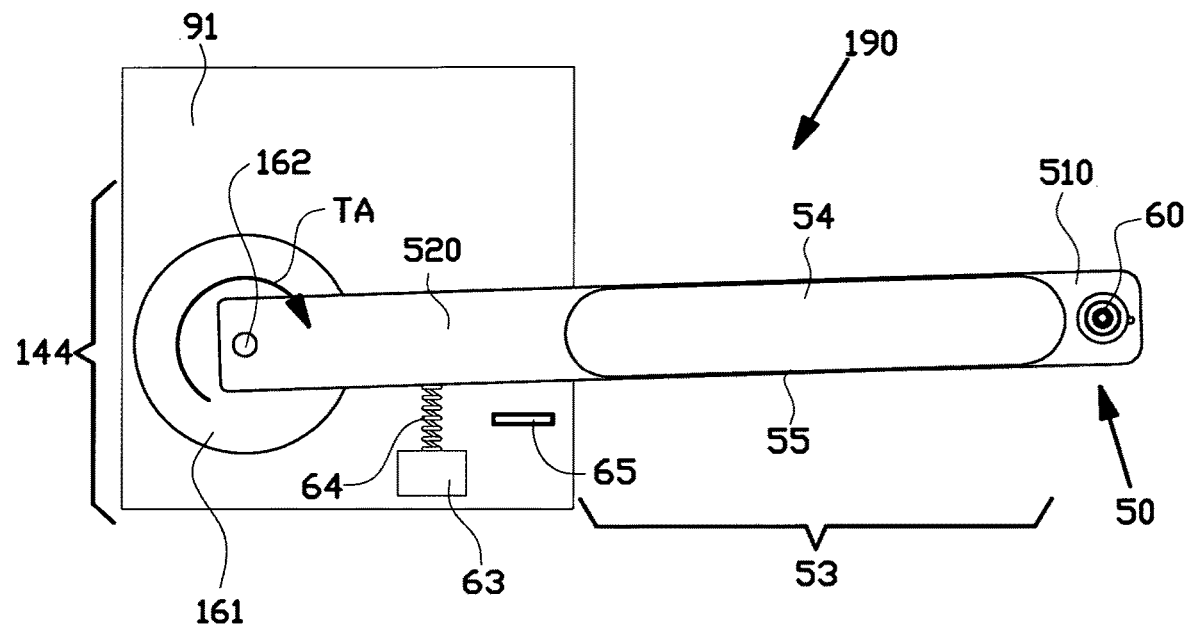
FIGS. 5A and 5B schematically show alternative embodiments of the force generating device.
Figure 5B:
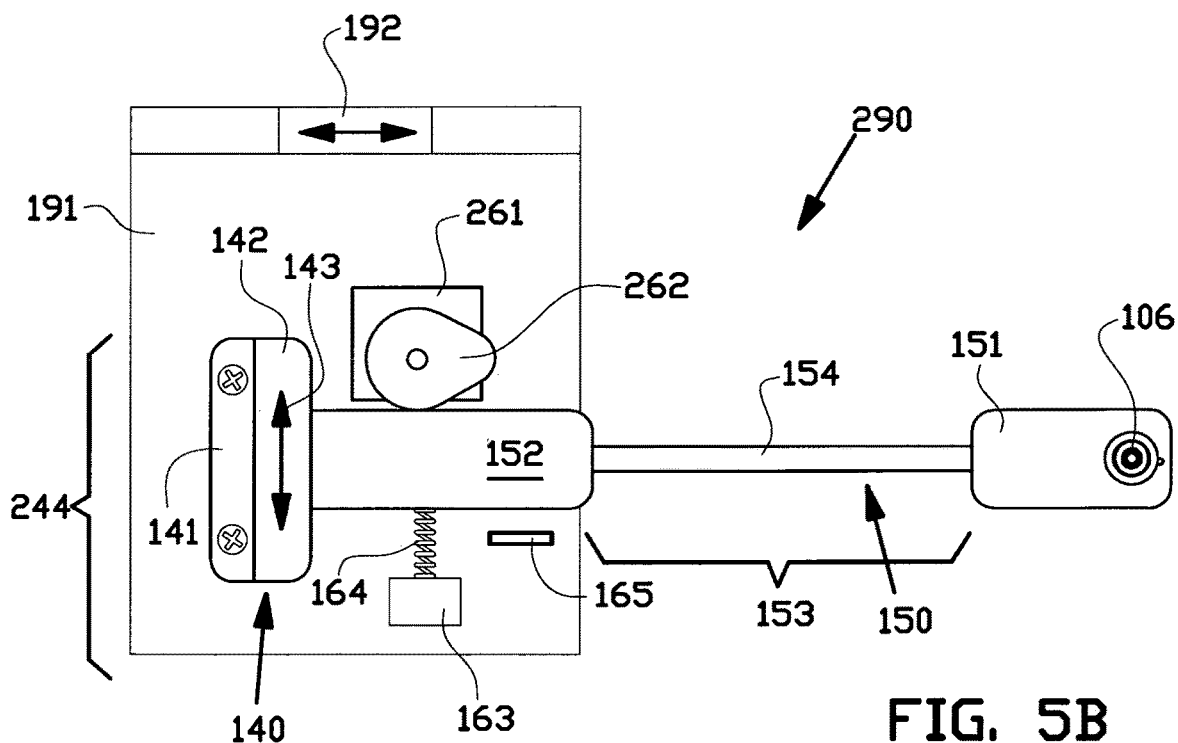

FIGS. 5A and 5B schematically show force generating devices 190, 290 according to alternative embodiments. The substrate positioning device 190, 290 of FIGS. 5A and 5B are suited to replace the force generating device 9 of FIGS. 2 and 3. In some embodiments, the force generating device 190, 290 is comprised in the alignment apparatus shown in FIG. 6A and 6B.

FIG. 5A shows a force generating device 190 comprising an actuator 161 comprising a drivable element 162 in the form of a rotating shaft, arranged for applying an actuating torque TA on the rigid proximal end 520 of the arm 50. In this embodiment, the actuator 161 forms part of the connection part 144 movably connecting the arm 50 to the alignment base 3. Upon application of an actuating torque TA, overcoming the spring force of the return spring 64, the actuator 161 causes a displacement of the rigid proximal end 520. This enables the application of a contact force FS by the contact section 60 on a substrate, in the same manner as described above with respect to FIG. 4B. The actuator 161 may, for example, comprise an electromotor. Alternatively, in applications which are not sensitive to contamination, the actuator 161 and the drivable element 162 may be realized by a gear or cogwheel arrangement.

The force generating device 290 according to the embodiment of FIG. 5B comprises a mounting plate 191 onto which a contact translation arrangement 140 is mounted. This translation arrangement forms part of a connection part 244 connecting the arm 150 to the mounting plate 191. The connection translation arrangement 140 comprises a mounting part 141 which is rigidly attached to the mounting plate 191, and translation part 142 which is rigidly attached to the rigid proximal end 152 of the arm 150. The contact translation arrangement 140 is arranged to translate the rigid proximal end 152 of the arm 150 in a direction parallel to movement direction 143 of the translation part 142, i.e., in a direction substantially perpendicular to the extension of the arm 150, in particular in a direction substantially parallel to an upper surface of a substrate 1. In this manner, the arm 150 moves along a substantially linear path.

The arm 150 comprises an elastically deformable arm section 153 arranged in a longitudinal direction along the length of the arm 150, between the rigid proximal end 152 and a rigid distal end 151 of the arm 150. In this embodiment the elastically deformable arm section 153 of the arm 150 comprises a single leaf spring 154. Alternatively, two parallel leaf springs could be used, analogous to the embodiment of FIG. 4A and 4B. The leaf spring 154 is arranged to be elastically deformable in the direction of movement towards the substrate and the notch (in particular in a direction substantially parallel to the plane of the drawing of FIG. 5), and to be substantially rigid in all other directions. Analogous to the embodiments described above, the contact force FS applied will be determined by the characteristics of the elastically deformable arm section 153.

An actuator 261 with a drivable element 262 in the form of a rotatably arranged excentric element is provided to induce a displacement of the rigid proximal end 152 along the movement direction 143 of the translation part 142. To this end, the drivable element 262 contacts the rigid proximal end 152 at a point at or close to the translation part 142. Rotating the excentric drivable element 262 will bring about a displacement of the rigid proximal end 152. A biasing element comprising a spring 164 fixed at one end 163 to the mounting plate 191, for pushing the rigid proximal end 152 of the arm 150 in a direction towards the actuator 261. A displacement stop 165 is provided to limit or confine the displacement of the rigid proximal end 152 of the arm 150. The displacement stop 165 can be fixed with respect to the mounting plate 191, or arranged with an adjustable position enabling adjustment of the maximum displacement of the rigid proximal end 152.

In some embodiments, the force generating device 290 is provided with an alignment translation arrangement 192, enabling the force generating device 290 to be translated, or moved, in a direction substantially parallel to the extension of the elastically deformable arm 153. Such translation arrangement 192 enables adjustment of the aligned position in $R_z$. This alignment translation arrangement 192 can also be used together with the force generating device 90 described with reference to FIGS. 4A and 4B and/or together with the force generating device 190 described with reference to FIG. 5A. Further, it should be noted that the various types of actuators described herein can replace one another, while still achieving the displacement of the proximal end of the arm.

FIG. 6A schematically shows, in a side view, a substrate alignment apparatus 110 comprising two contact members 8, the force generating device 90 shown in FIG. 4A and 4B, and an alignment base 3, and a substrate 1 arranged to be aligned. A substrate support member 2 may, as indicated by the dashed line, be placed on the alignment base 3 in order to support the substrate 1, and for alignment of the substrate 1 on the substrate support member. Alternatively, in an embodiment where the alignment apparatus is configured for alignment of the substrate directly onto the alignment base 3, the dashed line may indicate a substrate support area of the alignment base 3. Similar to FIG. 3 the alignment base 3 can be provided with three mounting members, forming a kinematic mount with alignment members provided on the lower side of the substrate support member.

As can be seen in FIG. 6A, the substrate is oriented in a plane, also referred to as alignment plane, parallel to a plane defined by the x, y-axes, and perpendicular to the z-axis. The contact section 60 provided at the distal end of the arm 50 and the two contact members 8 are positioned along the edge 14 of the substrate. When the substrate contacts the contact members 8 and the contact section 60, they define the aligned position of the substrate in the x,y plane, that is, the x-, y- alignment coordinates. The rotational position with respect to the z-axis, i.e., the $R_z$ coordinate, in the aligned condition is determined by the position of the contact section 60 or contact member 8 engaging the notch. The arm 50 is mounted to the mounting plate 91 via the connection part 44. The actuator 61, arranged to apply the actuating force FA on the rigid proximal end 520, is also mounted on the mounting plate 91. In the illustrated view, the actuating force FA is directed into the paper, i.e., to push the rigid proximal end 520 substantially towards the substrate, or at least having a component in a direction towards the substrate. As described above with reference to FIG. 4B, this leads to a flexure of bending of the elastically deformable arm section 53 of the arm 50, which in turn defines the contact force FS applied to the substrate 1 by the contact section 60.

In the embodiment of FIG. 6A, the mounting plate 91 is arranged on an alignment translation arrangement 92, arranged to enable translation of the mounting plate 91 in a direction parallel to the x-axis in the coordinate system of FIG. 6A. This enables setting the alignment position of the force generating device 90, more specifically the position of the contact section 60 along the edge of the substrate. The position of the contact section 60, in particular the angular position $\theta_z$ with respect to a rotation around the z-axis, defines the alignment position $R_z$ of the substrate. The alignment translation arrangement 92 hence enables adjusting the $R_z$ alignment of the substrate.

Alternatively either one of the force generating devices 190, 290 described above and illustrated in FIG. 5A and 5B can be used in the substrate alignment apparatus 110.

Figure 6B:
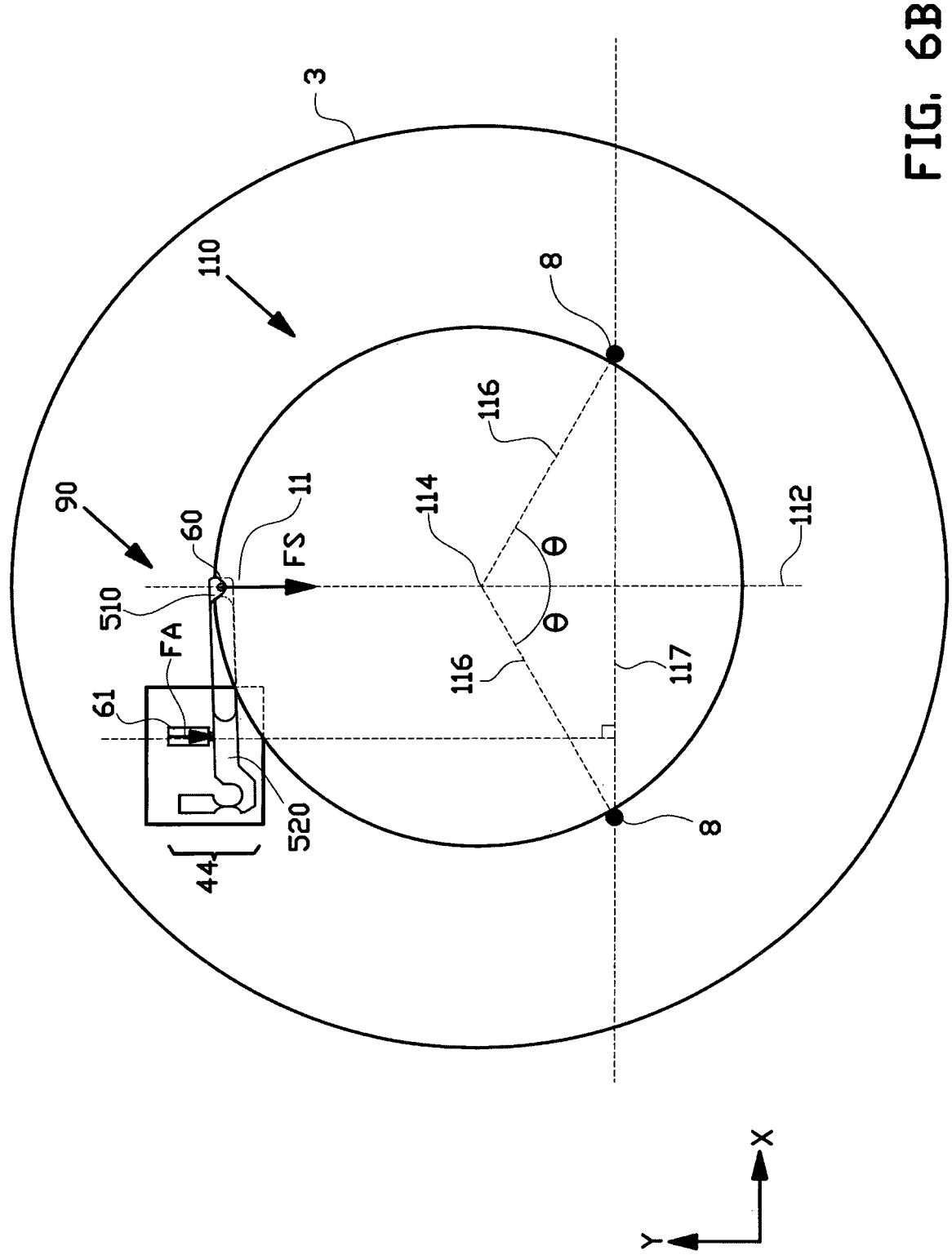
FIG. 6B schematically shows a top view of the substrate alignment apparatus of FIG. 6A.

FIG. 6B shows a top view of the substrate alignment apparatus 110 of FIG. 6A. In FIG. 6B, the substrate 1 is positioned to be aligned between the two contact members 8 and the contact section 60, the contact section 60 being positioned at the notch 11. The two contact members 8 are symmetrically arranged with respect to the contact section 60. In FIG. 6B, a first radial line 112 is shown, extending from the contact section 60, through the center 114 of the substrate support area defined by the contact members and the contact section. The second radial lines 116, each extending between a contact member 8 and the center 114, each form an angle θ with the first radial line 112. The arm 50 is arranged to extend in a direction substantially parallel to an interconnection line 117 intersecting the positions of the contact members, in particular when the arm, i.e. the elastically deformable section thereof, is not bent or flexed. The displacement of the rigid proximal end 520 resulting from the actuating force FA is directed substantially perpendicular to the interconnecting line 117. The contact force FS will be directed along the line 112, substantially perpendicular to and intersecting the interconnection line 117. This gives a symmetrical distribution of the contact force FS exerted by the arm 50 and the reaction forces from the contact members 8, the forces being directed in the inwards radial direction. This enables aligning the substrate with high accuracy.

FIGS. 7A-7D schematically show a top view of the substrate alignment apparatus 10, 110 at different stages during alignment of a substrate. In preferred embodiments, the substrate alignment apparatus is the substrate alignment apparatus 110 described above with respect to FIG. 6A and 6B, although the description herein below also applies to the substrate alignment apparatus 10 of FIGS. 2 and 3. The force generating device 109 is preferably the force generating device 90 described with reference to FIG. 4A and 4B, although it can alternatively be the force generating device 190, 290 illustrated in FIG. 5A or 5B. For clarity, the arm 105 is shown as a single member. Details of the elastically deformable arm section are not shown, but embodiments thereof can be seen in FIG. 4A, 4B, 5A, 5B.

A method for aligning a substrate 1 using the alignment apparatus 10, 110 comprises the following steps:

First a substrate 1 to be aligned is provided and placed on the alignment base 103 or on a substrate support member 2 (not shown) positioned on said alignment base 103. The substrate 1 is preferably positioned with the notch 11 located close to the contact section 106. Preferably, the contact section 106 at least partially engages the notch 11. Arranging the notch 11 in close proximity of the contact section 106 enables the contact section 106 to find the notch 11. The substrate 1 is usually pre-aligned, allowing the substrate 1 to be placed onto the alignment base 103 or onto the substrate support member in a known way and/or orientation.

In some embodiments, the method comprises the step of adjusting the position of the force generating device 109 prior to positioning the substrate and/or prior to applying the actuating force FA. In particular, the force generating device 109 can be moved in a direction substantially along the extension of the arm 105, such as to adjust the $R_z$ alignment coordinate of the wafer. As described above, when the contact section 106 is used for engaging the notch 11, the position of the contact section 106, in particular with respect to the contact members 108, 108', determines the resulting $R_z$ coordinate of the aligned substrate, i.e., the position of the substrate with respect to rotation around the z-axis. The aligned position of the substrate in the x, y coordinates are determined by the contact members 108, 108'.

Figure 7A:
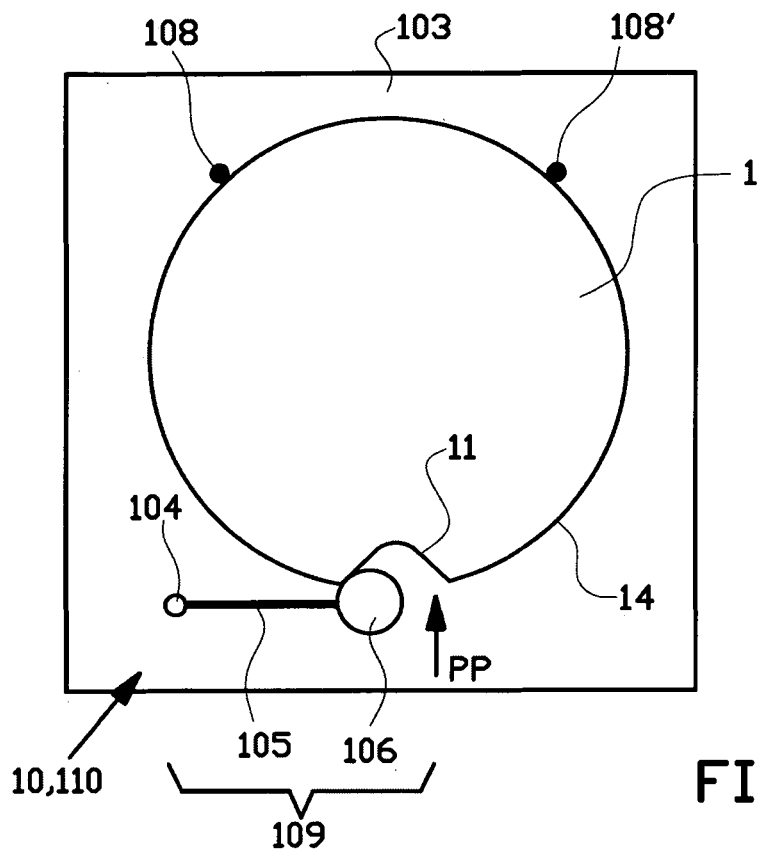
FIGS. 7A-7D schematically show a top view of a substrate alignment apparatus according to an embodiment of the invention at different stages during alignment.
Figure 7B:
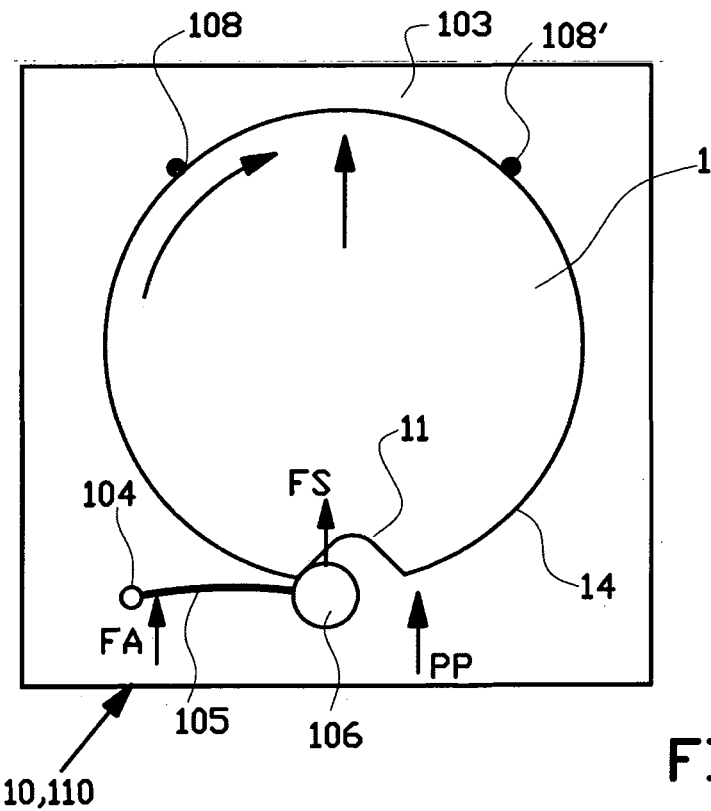

In a further step, as indicated in FIG. 7B, the rigid proximal end 520 of the arm is displaced and the contact section 106 is moved along a predetermined path PP towards the substrate 1. In the illustrated example, the displacement of the rigid proximal end of the arm is induced by an actuating force FA. However, it can also be induced by an actuating torque. When the contact section 106 contacts the edge 14 of the substrate 1, it exerts a force thereon. At this stage, further displacement of the rigid proximal end of the arm causes bending of the elastically deformable arm section, which results in a defined low contact force FS being applied to the substrate via the rigid distal end 151 of the arm 105. The contact section 106 engages the notch 11 and pushes the substrate 1 towards the two contact members 108, 108'. When the substrate 1 hits one of the contact members 108, the substrate 1 will start sliding against this contact member 108 while initiating a rotating and/or shifting motion of the substrate 1 due to the pushing action of the contact section 106 against the substrate edge in the notch 11.

Figure 7C:
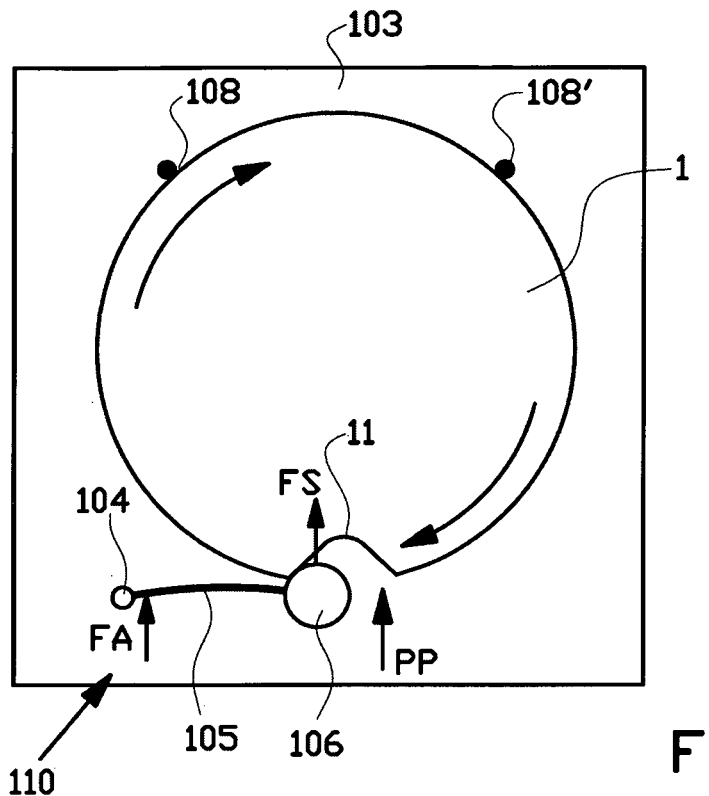
Figure 7D:
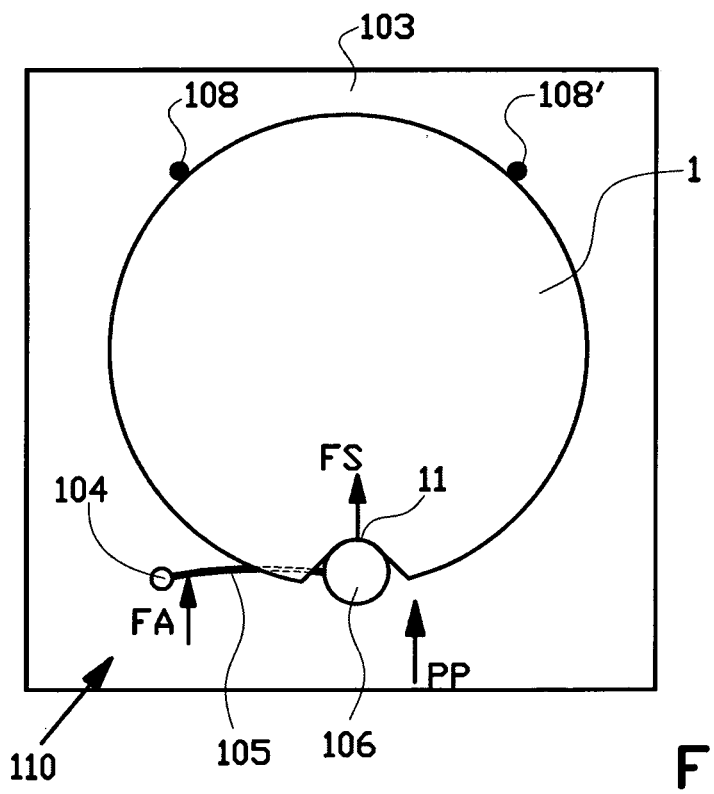

Subsequently, as shown in FIG. 7C, the substrate 1 will come into contact with the other contact member 108', and as a result of the contact members 108, 108' blocking further movement the contact section 106 will no longer induce a movement of the substrate 1 over the surface of the substrate support member. The force of the contact section 106 acting against a side edge of the notch 11 will result in a rotation action of the substrate 1 wherein the edge of the substrate 1 slides against the two contact members 108, 108', and the contact section 106 will move towards a center position in the notch 11. This situation is shown in FIG. 7C. When the substrate 1 is not yet in contact with the two contact members 108, 108', the contact section 106 will take the substrate 1 along and move the substrate 1 towards the two contact members 108, 108', as schematically shown in FIGS. 7B and 7C. The substrate 1 will then slide against the two contact members 108, 108' and finally the substrate 1 comes into contact with the two contact members 108, 108' as shown in FIG. 7D. The movement of the rigid proximal end of the arm 105 is terminated when the edge 14 of the substrate contacts all of the two contact members 108, 108' and the contact section 106, the contact members 108, 108' and the contact section 106 blocking any further movement of the substrate 1. At this point, the substrate is aligned, and the actuating force FA can be removed.

Hence, under the application of the actuating force FA the contact section 106 is pushed toward the edge 14 and engages the notch 11. This actuates a rotation and/or translation of the substrate 1, which is thereby pushed toward the contact members 108, 108', and rotating the substrate until the contact section 106 engages the notch 11 (FIG. 7D) and the substrate is in physical contact with the contact members 108, 108', and rotation and/or movement of the substrate stops.

Ultimately, when the contact section 106 is fully engaged with the notch 11, i.e. it is at its deepest possible position, the substrate 1 is positioned in its desired and final orientation. The final orientation of the substrate 1, the contact section 106 and the contact members 108, 108' preventing any further movement of the substrate, is an unambiguous and reproducible orientation. As a result, substrates can be mechanically aligned in a very efficient and reliable way over and over again without the need of complex marker processing equipment and/or a substrate adjustment arrangement.

It can be noted that the trajectory, i.e. the order of the movements, of the substrate 1 is not fixed, and/or not predictable. For example, contrarily to the situation indicated in FIGS. 7A-7D, the substrate 1 may come into contact with the right contact member 108' first, which causes the substrate 1 to rotate and/or shift in another direction which moves the substrate 1 to come into contact with the other contact member 108. Alternatively, the force applied by the contact section may cause the substrate to first rotate into position, and subsequently slide into contact with the contact members.

It is noted that the arm 105 may partly move underneath the substrate 1 and/or a substrate support member 2 arranged between the alignment base 103 and the substrate 1, as indicated by the dotted line of the arm 105 in FIG. 7D.

It is further noted that, alternatively, the substrate can be positioned such that one of the two contact members 108, 108' is made to engage the notch 11, with the contact section 106 pushing against the edge 14 of the substrate 1. In this situation, the contact section 106 will push the substrate 1 towards the contact member 108, 108' which engages the notch 11 until this contact member 108, 108' is fully engaged with the notch 11, i.e. it is at its deepest possible position, and the other contact member 108', 108 and the contact section 106 contact the edge 14 of the substrate 1. This provide a second final orientation of the substrate 1 against the contact members 108, 108' and the contact section 106. This will hence result in a different final orientation than the one shown in FIG. 6D, which however also provides an unambiguous and reproducible orientation.

Figure 8:
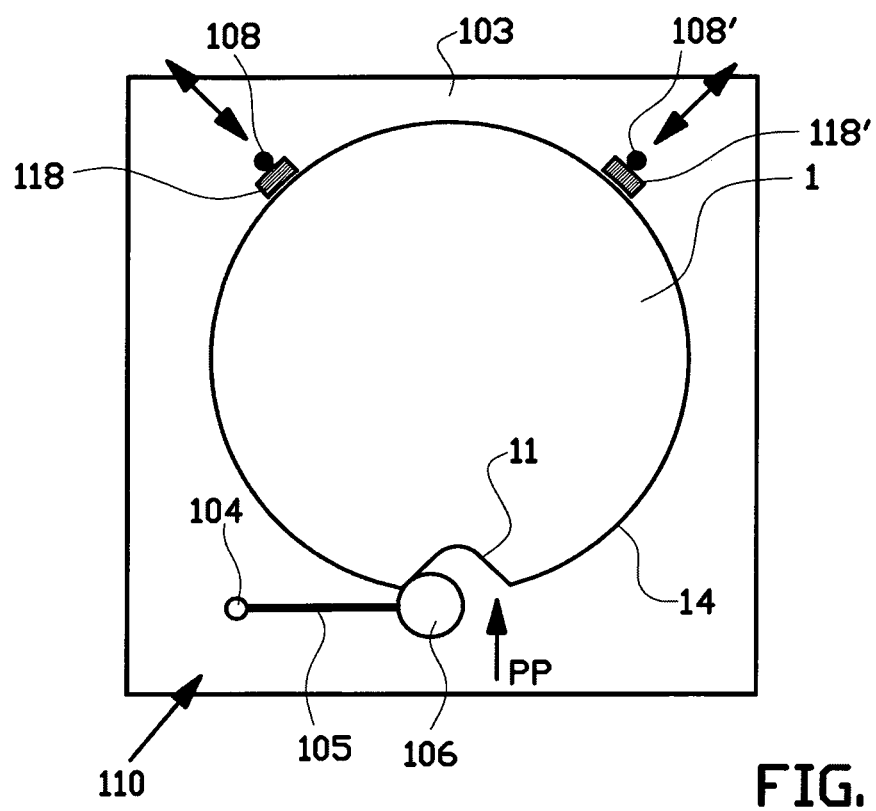
FIG. 8 schematically shows a top view of a substrate alignment apparatus comprising movable contact members.

FIG. 8 illustrates an embodiment of the alignment apparatus and the method for aligning a substrate, where the two contact members 8 are movable with respect to the alignment base 103 to provide greater clearance when placing the substrate 1 or the substrate support member on the alignment base 103. The contact members 108, 108' are movable in a direction parallel to the surface of the alignment base 103. In a first step, before placing the substrate and/or the substrate support member on the alignment base 103, the contact members 108, 108' are moved away from a center of the support area provided on the alignment base 103 into retracted positions, as indicated by the arrows in FIG. 8. This allows a substrate or substrate support member to be placed within the support area on the alignment base without interfering with the contact members 108, 108' and/or the force generating device 109. Once the substrate or the substrate support member has been placed on the alignment base 103, the two contact members 108, 108' are moved towards stop abutment members 118, 118' arranged for limiting the movement of the two contact members 108, 108'. The two contact members 108, 108' are now in second positions. The blocking members 118, 118' define the position of the two contact members 108, 108' on the alignment base 103 in which the contact members 108, 108' form a blocking structure for the substrate 1 during the alignment thereof. Subsequently, the substrate can be aligned according to the method described above with reference to FIG. 7A-7D.

During alignment, the contact members 108, 108' are fixed in the second position on the alignment base 103 which enable accurate positioning of the edge 14 of the substrate 1.

Figure 9:
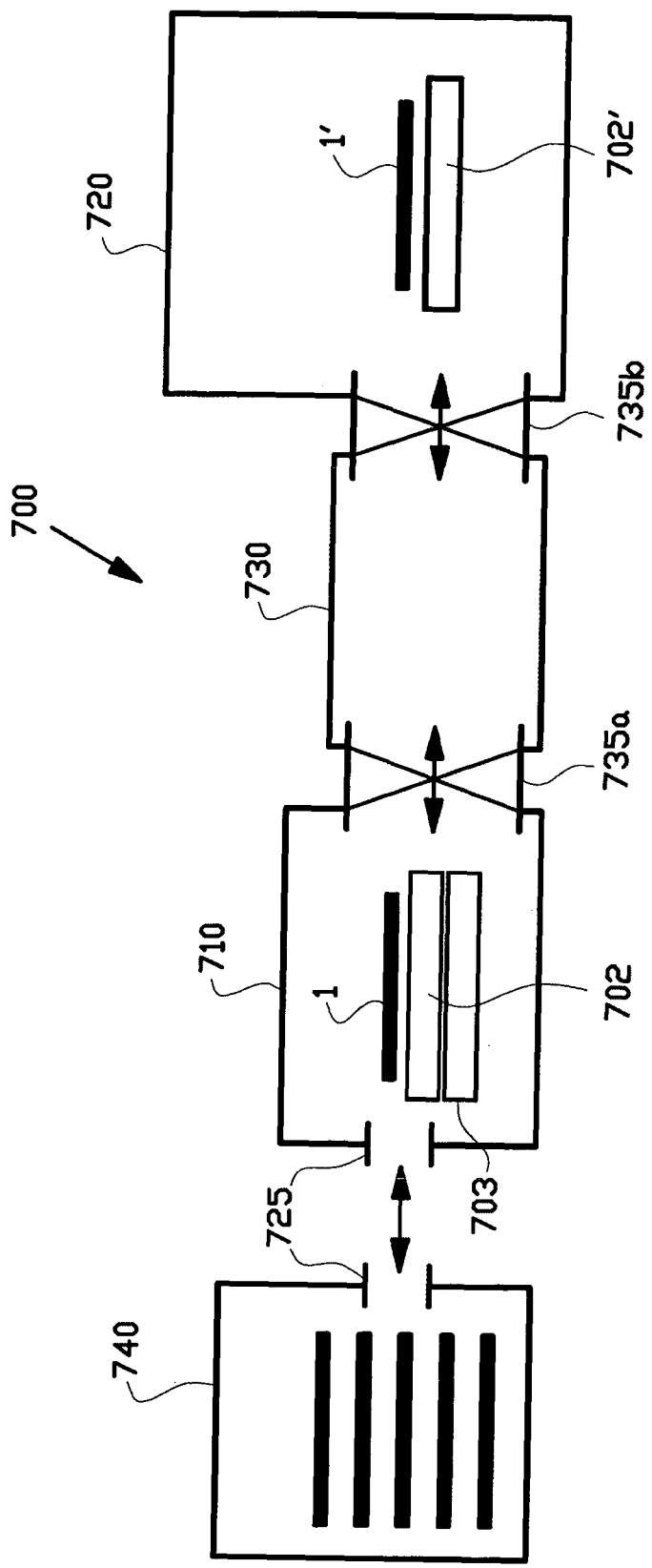
FIG. 9 schematically shows a substrate processing system including a substrate alignment apparatus.

FIG. 9 schematically shows a substrate processing assembly 700, such as a lithography system described above or a substrate inspection system. The substrate processing assembly comprises a substrate alignment station 710, a substrate processing apparatus 720, for example a lithographic apparatus or a substrate inspection apparatus, and a transfer system 730, such as a load lock, for transferring a substrate 1 from the substrate alignment apparatus 710 to the substrate processing apparatus 720, and from the substrate processing apparatus back to the substrate alignment apparatus. The substrate processing assembly is preferably coupled to a substrate track or supply arrangement 740. The substrate alignment apparatus according to the present invention can advantageously be used in the alignment station 710, enabling alignment of the substrates 1 onto a carrier 702 prior to transporting the carrier with the substrate into the substrate processing apparatus 720.

A substrate 1 is loaded into the substrate alignment system 710 via a loading port 725. Preferably, the substrate has been pre-aligned into a predetermined orientation.

Inside the alignment system 710, the alignment apparatus according to the present invention is arranged. The alignment apparatus comprises an alignment base 703 provided with a substrate support member 702 on top of which the substrate 1 is positioned in a substantially known orientation. Subsequently, the substrate 1 is aligned on top of the substrate support member 702, for example using the steps as shown in FIGS. 7A-7D and described in detail above.

After alignment, the substrate 1 is clamped onto the substrate support member 702 in order to fix the position of the substrate 1 on top of the substrate support member 702. The substrate alignment apparatus is preferably combined with a clamp preparation arrangement for clamping the substrate 1 onto the substrate support member 702. In some embodiments, clamping the substrate 1 onto the substrate support member 702 is achieved by using a thin layer of water. The thin layer of water is applied on the substrate support member 702, and the substrate 1 is placed on the layer of water. While the substrate 1 "floats" on the layer of water, and hence experiences very low friction with the surface of the substrate support member, the substrate 1 is aligned by the substrate alignment apparatus 10, 110. When the substrate 1 is properly aligned, the substrate is clamped on the substrate support member 702 by capillary forces exerted as the water layer is partially removed. By clamping using a low clamping force on a low friction surface, the substrate 1 is clamped without distorting the substrate 1 due to the applied clamping force.

After clamping the combination of the substrate 1' and the substrate support member 702' are transferred to the substrate processing apparatus 720 via the transfer system 730, connected between the substrate alignment station 710 and the substrate processing apparatus 720 via independently operable ports 735a, 735b.

Figure 10A:
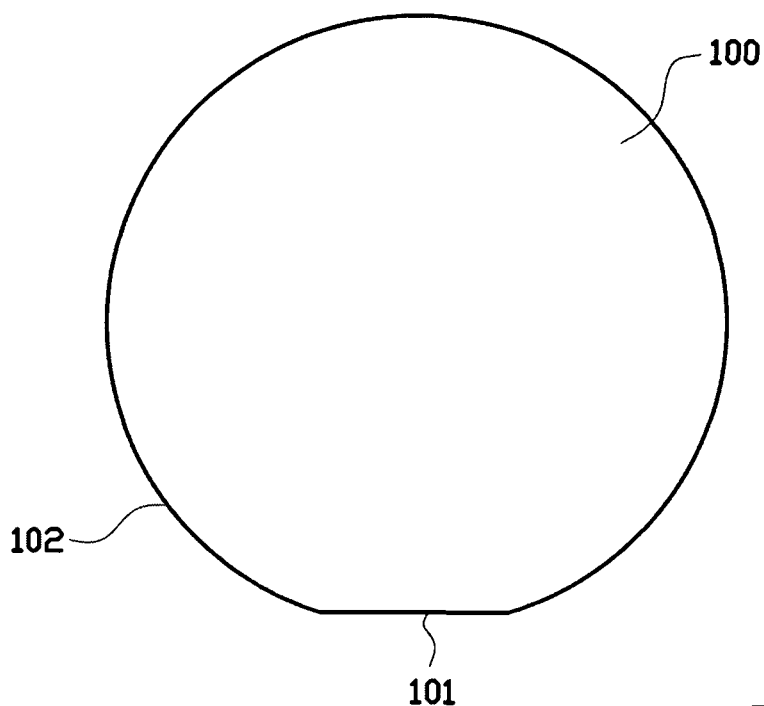
FIG. 10A schematically shows an industry standard substrate provided with an orientation flat.
Figure 10B:
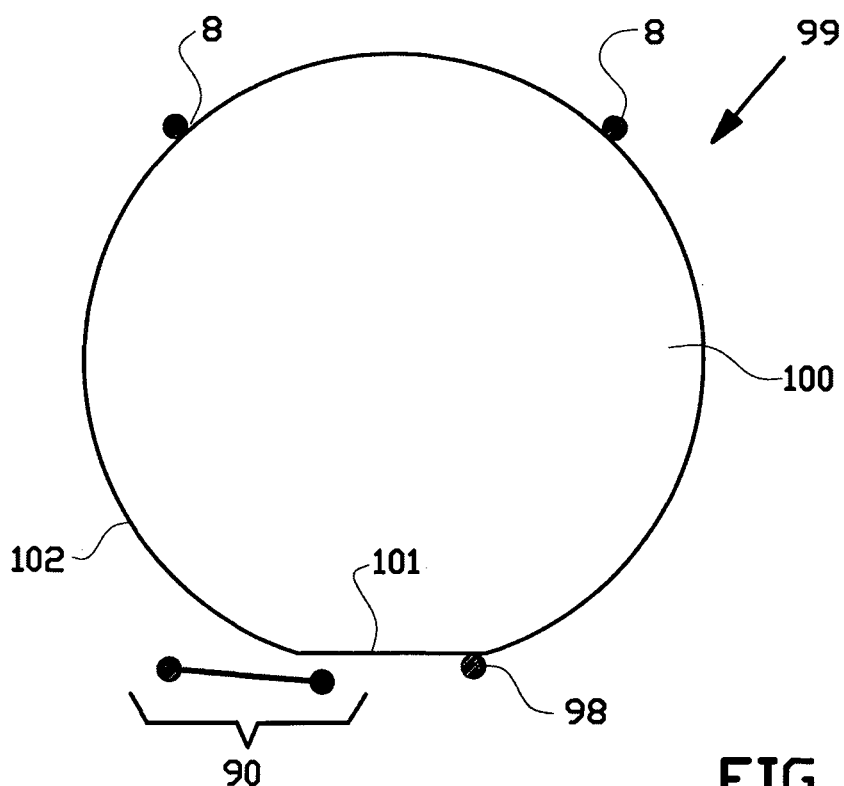
FIG. 10B schematically shows a substrate alignment apparatus for aligning the substrate illustrated in FIG. 10A.

FIG. 10B schematically shows a substrate alignment apparatus 99 arranged for aligning a substrate 100 provided with an orientation mark in the form of an orientation flat 101 provided in the edge 102, as illustrated in FIG. 10A. The substrate alignment apparatus can be a modification of the substrate alignment apparatus shown in FIG. 6A and 6B. In principle, the substrate alignment apparatus 99 differs from the apparatus 110 of FIG. 6A, 6B by the presence of a third contact member 98, as shown in FIG. 10B.

The alignment apparatus 99 is provided with three contact members 8, 98. Two of the contact members, indicated by reference numbers 8, are arranged similar to the contact members 8 in the alignment apparatus 110 of FIG. 6A and 6B. The third contact member 98 is arranged to contact the orientation flat 101. The contact section 60 of the force generating device 90 is also arranged for contacting the orientation flat 101. Similar to the above, the contact members 8, 98 are either fixed with respect to the alignment base, or movable with respect to the alignment base, such as to be moved between a first, retracted position, and a second position, where the contact members 8, 98 are positioned at the circumference of a support area. The substrate is positioned onto the alignment base with the orientation flat substantially facing the third contact member 98 and the contact section 60 of the force generating device 90. As an actuating force FA is applied to the arm 50, the rigid distal end 510 provided with the contact section 60 moves toward and into contact with the orientation flat 101, pushing the substrate into an aligned position.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

Clause 1: Alignment apparatus for aligning a substrate (1; 100), said alignment apparatus comprising an alignment base (3) for supporting said substrate (1) and/or a substrate support member (2), and a force generating device (9; 90; 190) arranged for applying a contact force (FS) on said substrate, characterized by said force generating device comprising an arm (5; 50; 150) comprising a rigid proximal end (520), a rigid distal end (510), and an elastically deformable arm section (53) extending between said rigid proximal end and said rigid distal end, a connection part (4;

44,-144) connecting said rigid proximal end to said alignment base, said arm being movable with respect to said alignment base (3) via said connection part, an actuator (61; 161) arranged to act on said rigid proximal end to cause a displacement thereof, said rigid distal end of said arm being provided with a contact section (6; 60; 106) for contacting an edge of said substrate, whereby, by said displacement of said rigid proximal end, said contact force (FS) is applied to said substrate by said contact section and is defined by said elastically deformable arm section and by said displacement.

Clause 2: Alignment apparatus according to clause 1, comprising two contact members (8) connected to said alignment base and arranged for contacting said edge of said substrate.

Clause 3: Alignment apparatus according to clause 2, wherein said displacement of said rigid proximal end is directed perpendicular to an interconnecting line (117) interconnecting said two contact members (8).

Clause 4: Alignment apparatus according to clause 2 or 3, wherein the arm is arranged to extend in a direction parallel to interconnecting line (117) between said two contact members (8), in particular when the elastically deformable arm section is not bent or flexed.

Clause 5: Alignment apparatus according to any one of clauses 2-4, wherein said contact members (8) are arranged to be movable towards and away from a center (114) of an area defined by said contact members (8) and said contact section (6; 60).

Clause 6: Alignment apparatus according to any one of clauses 2-5, wherein the elastically deformable arm section is arranged to extend perpendicular to a direction of said displacement of said rigid proximal end, the elastically deformable arm section being oriented tangential to said edge of said substrate.

Clause 7: Alignment apparatus according to any one of clauses 1-6, wherein the elastically deformable arm section comprises one or more leaf springs.

Clause 8: Alignment apparatus according to clause 7, wherein said elastically deformable arm section comprises a first leaf spring and a second leaf spring, wherein the second leaf spring is arranged substantially parallel to the first leaf spring and at a distance from the first leaf spring, in a direction substantially perpendicular to the surface of the first leaf spring.

Clause 9: Alignment apparatus according to any one of clauses 1-8, wherein said alignment apparatus comprises a displacement stop (65) for limiting said displacement of said rigid proximal end.

Clause 10: Alignment apparatus according to any one of clauses 1-9, wherein said connection part (4; 44) comprises an elastically deformable connection section (40) connected at a first end to said rigid proximal end and at a second end to a mounting part (41), said mounting part (41) connected to said alignment base (3).

Clause 11: Alignment apparatus according to clause 10, wherein said elastically deformable connection section (40) comprises a portion of reduced cross section.

Clause 12: Alignment apparatus according to any one of clauses 1-11, comprising a mounting plate (91; 191) to which said actuator (61; 161) and said connection part (4; 44; 144) are connected, wherein said mounting plate (91; 191) is connected to said alignment base by an alignment translation arrangement (92; 192), said alignment translation arrangement arranged to provide a translating movement of said arm in a direction parallel to an extension of said arm.

Clause 13: Alignment apparatus according to any one of clauses 1-12, wherein the alignment apparatus is arranged for aligning a substrate provided with a notch (11) in its edge (14), wherein the contact section (6; 60; 106) is arranged to engage the notch, or, wherein the alignment apparatus is arranged for aligning a substrate provided with an orientation flat (101) in its edge (102), said alignment apparatus comprising a third contact member (98), arranged to contact said orientation flat, and wherein the contact section (60; 106) is arranged to contact the orientation flat.

Clause 14: Alignment apparatus according to any one of clauses 1-13, comprising a substrate support member (2) for supporting said substrate and a kinematic mount (21, 31), wherein said apparatus configured to align said substrate on said substrate support member, wherein said substrate support member (2) is positioned on said alignment base (3) via said kinematic mount (21, 31).

Clause 15: Lithography system (700) comprising a lithography apparatus and a substrate alignment station, said substrate alignment station comprising an alignment apparatus (10) according to anyone of the preceding clauses for aligning a substrate (1) prior to introducing said substrate into said lithography apparatus, Clause 16: A force generating device (9; 90; 190) for applying a predefined contact force (FS) on an object, said force generating device characterized by: an arm (5; 50; 150) comprising a rigid proximal end (520) and a rigid distal end (510), and an elastically deformable arm section (53) extending between said rigid proximal end and said rigid distal end, a connection part (4; 44; 144) connecting said rigid proximal end to a mounting part-(41; 141), such that said arm is movable with respect to said mounting part via said connection part (4), an actuator (61; 161) arranged for acting on said rigid proximal end to cause a displacement thereof with respect to said mounting part; said rigid distal end of said arm being provided with a contact section (6; 60; 106) for contacting said object, whereby, by said displacement of said rigid proximal end, a contact force (FS) is applied to said object by said contact section, said force being defined by said elastically deformable arm section and by said displacement of said rigid proximal end.

Clause 17: Force generating device according to clause 16, wherein said contact force is constant when said displacement of said rigid proximal end with respect to said rigid distal end is within a predetermined interval.

Clause 18: Force generating device according to clause 16 or 17, wherein the elastically deformable arm section extends perpendicular to a direction of said displacement of the rigid proximal end.

Clause 19: Force generating device according to any one of clauses 16-18, wherein the elastically deformable arm section comprises one or more leaf springs.

Clause 20: Force generating device according to clause 19, wherein said elastically deformable arm section comprises a first leaf spring and a second leaf spring, wherein the second leaf spring is arranged substantially parallel to the first leaf spring and at a distance from the first leaf spring, in a direction substantially perpendicular to the surface of the first leaf spring.

Clause 21: Force generating device according to any one of clauses 16-20, comprising a displacement stop (65) for limiting said displacement of said rigid proximal end.

Clause 22: Force generating device according to any one of clauses 16-21, comprising a bias arrangement, arranged to generate a biasing force (FB) directed opposite to said displacement.

Clause 23: Force generating device according to any one of clauses 16-22, wherein said connection part (4; 44) comprises an elastically deformable connection section (40)

connected at a first end to said rigid proximal end and at a second end to said mounting part (41).

Clause 24: Force generating device according to clause 23, wherein said elastically deformable connection section (40) extends between a rigid section (42) connected to said rigid proximal end and said mounting part (41), and wherein said elastically deformable connection section (40) comprises a portion of reduced cross section.

Clause 25: Method for aligning a substrate (1; 101), the method comprising positioning the substrate on an alignment base (3) or on a substrate support member (2) positioned on an alignment base (3); providing a force generating device (9; 90; 190) for applying a contact force (FS) on an edge (14; 102) of said substrate, said force generating device comprising an arm (5; 50; 150) comprising a rigid proximal end (520; 152), a rigid distal end (510; 151), and an elastically deformable arm section (53; 153) extending between said rigid proximal end and said rigid distal end, said rigid distal end of said arm being provided with a contact section (6; 60; 106) for contacting said edge of said substrate, a connection part (4; 44; 144) connecting said rigid proximal end to said alignment base, said arm being movable with respect to said alignment base (3) via said connection part, an actuator (61; 161) arranged to act on and cause a displacement of said rigid proximal end, whereby, by said displacement said contact force (FS) is applied to said substrate by said contact section, said contact force being defined by said elastically deformable arm section and by said displacement, —activating said actuator acting on said rigid proximal end, thereby causing said displacement of the rigid proximal end of said arm, thereby applying said contact force (FS) to said edge and causing a rotation and/or translation of said substrate into an aligned position.

Clause 26: Method according to clause 25, wherein said displacement and/or said contact force (FS) are directed within or parallel to a plane defined by a surface of said substrate.

Clause 27: Method according to clause 25 or 26, wherein the method is applied on a substrate provided with a notch (11) in its edge, the method comprising the steps of positioning the notch in close proximity of the contact section, engaging the notch with the contact section, thereby actuating a rotation and/or translation of the substrate when the rigid proximal end of the arm is displaced.

Clause 28: Method according to any one of clauses 25-27, wherein said displacement of the rigid proximal end of the arm is terminated when said edge of said substrate contacts the contact section and two contact members, said contact section and said contact members confining movement of said substrate.

Clause 29: Method according to clause 28, comprising the steps of positioning said contact members in a first position, said first position being remote from a second position, positioning the substrate on said substrate support member, moving said contact members to said second position, thereby moving the contact members in a direction towards said substrate, causing a displacement of said rigid proximal end such that said contact section and said contact members contact said edge of said substrate.

Clause 30: Method according to clause 27 or 28, comprising the step of adjusting a position of said force generating device with respect to said contact members, in particular prior to causing said displacement of said rigid proximal end.

The invention claimed is:

1. A force generating device arranged for applying a contact force on an object, said force generating device comprising:

an arm comprising a rigid proximal end, a rigid distal end, and an elastically deformable arm section extending between said rigid proximal end and said rigid distal end, a connection part connecting said rigid proximal end to a mounting part, said arm being movable with respect to said mounting part via said connection part, an actuator arranged to act on said rigid proximal end to cause a displacement thereof, said rigid distal end of said arm being provided with a contact section for contacting said object, wherein, by said displacement of said rigid proximal end, said contact force is applied to said object by said contact section and is defined by said elastically deformable arm section and by said displacement of said rigid proximal end.

2. The force generating device according to claim 1, wherein the elastically deformable arm section is arranged to extend perpendicular to a direction of said displacement of said rigid proximal end.

3. The force generating device according to claim 1, wherein the elastically deformable arm section comprises one or more leaf springs.

4. The force generating device according to claim 3, wherein said elastically deformable arm section comprises a first leaf spring and a second leaf spring, wherein the second leaf spring is arranged substantially parallel to the first leaf spring and at a distance from the first leaf spring, in a direction substantially perpendicular to the surface of the first leaf spring.

5. The force generating device according to claim 1, wherein said alignment apparatus comprises a displacement stop for limiting said displacement of said rigid proximal end.

6. The force generating device according to claim 1, wherein said connection part comprises an elastically deformable connection section connected at a first end to said rigid proximal end and at a second end to a mounting part.

7. The force generating device according to claim 1, comprising a bias arrangement, arranged to generate a biasing force directed opposite to said displacement.

8. The force generating device according to claim 7, wherein the biasing element provides a force which is arranged to push the rigid proximal end of the arm towards the actuator, in order to substantially ensure that the arm stays in abutment with the actuator so that no displacement of the arm occurs when the actuator is not active.

9. Alignment apparatus for aligning a substrate, said alignment apparatus comprising:

an alignment base for supporting said substrate and/or a substrate support member for supporting said substrate; and a force generating device according to claim 1 arranged for applying a contact force on said substrate, wherein said connection part connects said rigid proximal end to said alignment base, such that said arm is movable to said alignment base via said connection part.

10. The alignment apparatus according to claim 9, wherein the elastically deformable arm section is oriented substantially tangential to said edge of said substrate with respect to the point where the contact section contacts said substrate.

11. The alignment apparatus according to claim 9, comprising two contact members connected to said alignment base and arranged for contacting said edge of said substrate.

12. The alignment apparatus according to claim 11, wherein said displacement of said rigid proximal end is directed perpendicular to an interconnecting line interconnecting said two contact members.

13. The alignment apparatus according to claim 11, wherein the arm is arranged to extend in a direction parallel to an interconnecting line between said two contact members.

14. The alignment apparatus according to claim 11, wherein said contact members are arranged to be movable towards and away from a center of an area defined by said contact members and said contact section.

15. The alignment apparatus according to claim 9, comprising a mounting plate to which said actuator and said connection part are connected,
wherein said mounting plate is connected to said alignment base by an alignment translation arrangement, said alignment translation arrangement arranged to provide a translating movement of said arm in a direction parallel to an extension of said arm.

16. The alignment apparatus according to claim 9, wherein the alignment apparatus is arranged for aligning a substrate provided with a notch in its edge, wherein the contact section is arranged to engage the notch, or, wherein the alignment apparatus is arranged for aligning a substrate provided with an orientation flat in its edge, said alignment apparatus comprising a third contact member, arranged to contact said orientation flat, and wherein the contact section is arranged to contact the orientation flat.

17. The alignment apparatus according to claim 9, comprising a substrate support member for supporting said substrate and a kinematic mount, wherein said apparatus configured to align said substrate on said substrate support member, wherein said substrate support member is positioned on said alignment base via said kinematic mount.

18. Substrate processing system comprising a substrate processing apparatus and a substrate alignment station, said substrate alignment station comprising an alignment apparatus according to claim 9 for aligning a substrate prior to introducing said substrate into said substrate processing apparatus.

19. Substrate processing system according to claim 18, wherein said substrate processing apparatus is a lithographic apparatus or a substrate inspection apparatus.

20. Method for aligning a substrate, the method comprising:
positioning the substrate on an alignment base or on a substrate support member positioned on an alignment base;
providing a force generating device for applying a contact force on an edge of said substrate, said force generating device comprising:
an arm comprising a rigid proximal end, a rigid distal end, and an elastically deformable arm section extending between said rigid proximal end and said rigid distal end, said rigid distal end of said arm being provided with a contact section for contacting said edge of said substrate,
a connection part connecting said rigid proximal end to said alignment base, said arm, including said rigid proximal end, being movable with respect to said alignment base via said connection part,
an actuator arranged to act on and cause a displacement of said rigid proximal end, wherein, by said displacement of said rigid proximal end said contact force is applied to said substrate by said contact section, said contact force being defined by said elastically deformable arm section and by said displacement,
activating said actuator acting on said rigid proximal end, thereby causing said displacement of the rigid proximal end of said arm, thereby applying said contact force to said edge and causing a rotation and/or translation of said substrate into an aligned position.

* * * * *